United States Patent [19]

Nishizawa et al.

[11] Patent Number: 5,017,991
[45] Date of Patent: May 21, 1991

[54] LIGHT QUENCHABLE THYRISTOR DEVICE

[75] Inventors: Jun-ichi Nishizawa; Takashige Tamamushi; Ken-ichi Nonaka, all of Sendai, Japan

[73] Assignee: Jun-Ichi Nishizawa, Sendai, Japan

[21] Appl. No.: 259,438

[22] Filed: Oct. 14, 1988

Related U.S. Application Data

[63] Continuation of Ser. No. 714,678, Mar. 21, 1985, abandoned.

[30] Foreign Application Priority Data

Mar. 22, 1984 [JP]  Japan .................................. 59-54937

[51] Int. Cl.$^5$ ............................................ H01L 29/74
[52] U.S. Cl. ...................................... 357/38; 357/22; 357/30; 357/39; 307/631
[58] Field of Search ................ 357/38, 39, 22 B, 30 I; 307/631

[56] References Cited

U.S. PATENT DOCUMENTS

| | | | |
|---|---|---|---|
| 3,708,672 | 1/1973 | Marinkovic | 307/631 |
| 4,354,121 | 10/1982 | Terasawa et al. | 307/252 C |
| 4,608,587 | 8/1986 | Nishizawa | 357/30 |

FOREIGN PATENT DOCUMENTS

| | | | |
|---|---|---|---|
| 0021086 | 1/1981 | European Pat. Off. | 357/22 B |
| 3011484 | 10/1980 | Fed. Rep. of Germany | 357/22 B |
| 2443172 | 6/1980 | France | 357/22 B |
| 53-20885 | 2/1978 | Japan . | |
| 54-37461 | 3/1979 | Japan | 307/631 |
| 55-24406 | 2/1980 | Japan | 307/631 |
| 55-88426 | 7/1980 | Japan | 307/631 |
| 55-128870 | 10/1980 | Japan . | |
| 55-151825 | 11/1980 | Japan | 307/631 |
| 59-40576 | 3/1984 | Japan . | |
| 81-489 | 2/1981 | World Int. Prop. O. | 357/22 E |

OTHER PUBLICATIONS

International Electron devices meeting, San Francisco, Dec. 9-12, 1984, pp. 435-438, IEDM; J.. Nishizawa et al.: "A very high sensitivity and very high speed light triggered and light quenched static induction thyristor (LTQSITHY)".

Japanese Journal of Applied Physics, supplements 16th int. conf. solid state devices and materials, Kobe, Aug. 30-Sep. 14, 1984, pp. 321-324, Tokyo, Jp; J. Nishizawa et al: "Totally light controlled thyristor-optically triggerable and optically quenchable static induction photo-thyristor".

International Electron Devices Meeting, San Francisco, Dec. 13-15, 1982, pp. 261-263, IEE; L. Leipold et al.: "600V/5A FET-triggered lateral opto-triac".

Japanese Journal of Applied Physics vol. 16, supplement 16-1, Proceedings of the 18th Conference on solid state devices, 1976, pp. 541-544, Tokyo, Jp.; J. Nishizawa et al.: "Characteristics of new thyristors".

"Fabrication and Optical-Switching Results on the Integrated Light-Triggered and Quenched Static Induction Thyristor" IEEE Transactions on Electron Devices, vol. ED-33, No. 12 Dec. 1986, Jun-Ichi Nishizawa, Fellow, IEEE, Takashige Tamamushi, Member, IEEE, Ken-Ichi Nonak & Hiraku Watanabe pp. 2031-2040.

(List continued on next page.)

*Primary Examiner*—Rolf Hille
*Assistant Examiner*—Steven Loke
*Attorney, Agent, or Firm*—Cushman, Darby & Cushman

[57] ABSTRACT

A thyristor device comprising an SI (Static induction) thyristor or beam base thyristor and an SIT (static induction transistor) or SIT-mode bipolar transistor connected to the gate of the thyristor in order to make it possible to turn-on and-off a direct current and voltage at a high speed with a light. In the thyristor part, the SIT gate structure or SIT-mode beam base structure exists in the first gate or base region or second gate or base region so that, at the time of the triggering operation, a very high switching efficiency will be obtained.

21 Claims, 12 Drawing Sheets

OTHER PUBLICATIONS

"Fabrication and Optical-Switching Results of the Double-Gate Static-Induction Thyristor with the First Planar-Gate and the Second Buried-Gate Structure" IEEE Electron Device Letters, vol. EDL-7, No. 3, Mar. 1986, J. I. Nishizawa, Fellow, IEEE, T. Tamamushi, Member IEEE K. Nonaka & S. Shimomura pp. 175–178.

"A Double-Gate-Type Static-Induction Thyristor" IEEE Trans. on Electron Devices vol. ED34, No. 6 6/87 J. I. Nishizawa et al. pp. 1396–1406.

"Current Amplication in nonhomogeneous-base structure and Static Induction Transistor Structure", J. I. Nishizawa and K. I. Nonaka, pp.4783–4797.

"A Very High Sensitivity and High Speed Light Triggered and Light Quenched Static Induction Thyristor (LTQSITHY)", J. Nishizawa, T. Tamamushi & K. Nonaka, pp. 435–437.

"New Thyristor Applicable to DC Power Transmission", J. Nishizawa & T. Tamamushi, pp. 304–309.

"Functional Integration of the Light-Triggered Static Induction Thyristor and the Static Induction Phototransistor", J. Nishizawa, Fellow, IEEE. T. Tamamushi, Member, IEEE, and K. Nonaka, pp. 265–267.

Roggwiler, Totally Light Controlled Switch 1980 IEDM Conf. Proc., pp. 646–648.

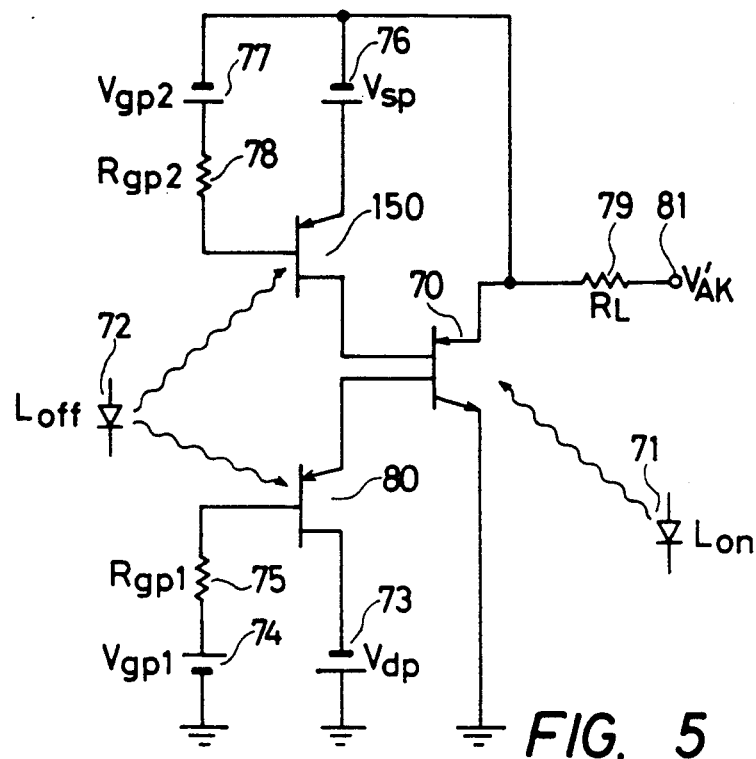
FIG. 5
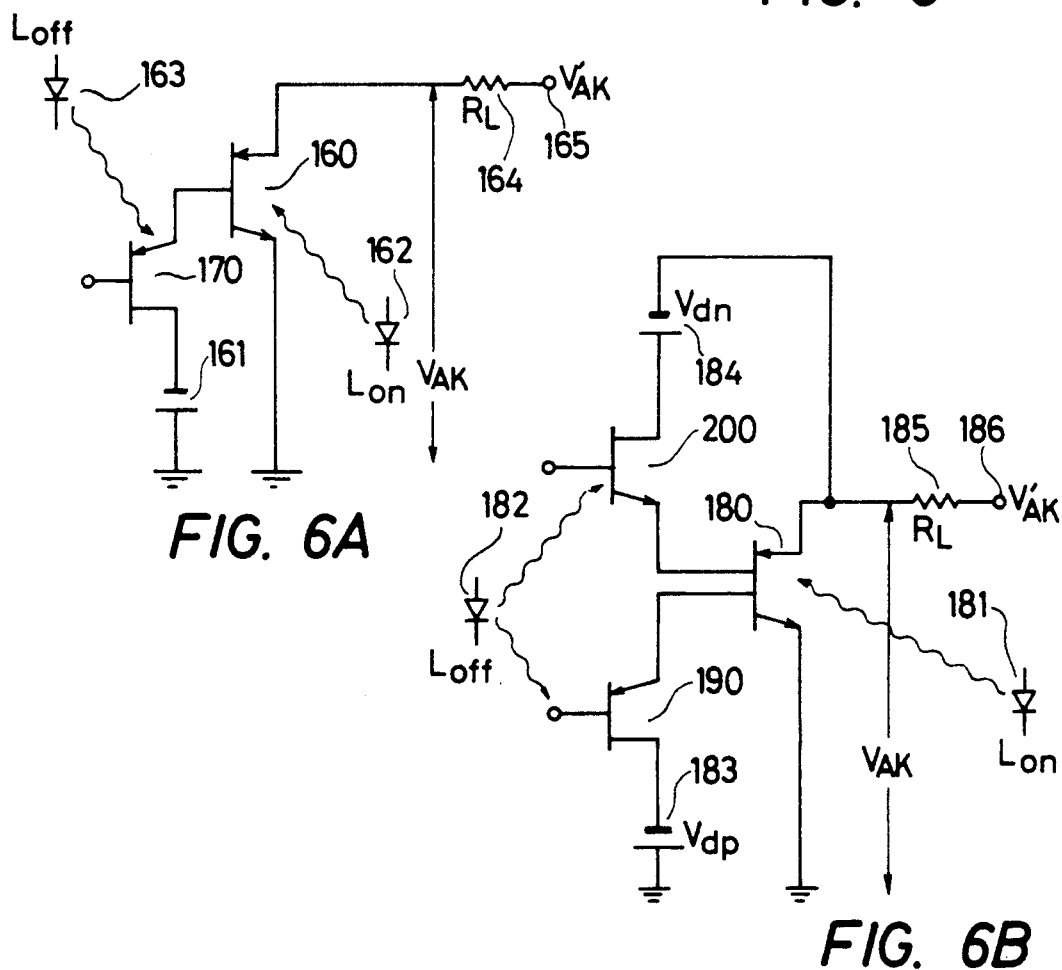
FIG. 6A
FIG. 6B

LIGHT QUENCHABLE THYRISTOR DEVICE

This is a continuation of application Ser. No. 714,678, filed Mar. 21, 1985, now abandoned.

BACKGROUND OF THE INVENTION (a) Field of the Invention

This invention relates to a light quenchable thyristor device which can be utilized in a device for converting a direct current or voltage of a large electric power to an alternating current or voltage.

(b) Description of the Prior Art

It is already well known that a thyristor device can be driven by light and is extensively practiced in the name of an LASCR or a Light Activated Thyristor. It is generally said that, in a large electric power converting device which uses a thyristor, the perfect separation of the large electric power part and control circuit from each other is realized by making the thyristor operable from a light trigger. FIG. 1 shows the structure of the light triggering part of a thyristor having a conventional pnpn structure. The n+ region 1 represents a cathode, p region 2 represents a first base, n region 3 represents a second base) the p+ region 4 represents an anode, 6 represents an anode electrode and 9 represents a cathode electrode. The $n^{30}$ region 7 represents cathode region of an auxiliary thyristor and is formed to be shallow in a part in order to increase the number of pairs of electrons and positive holes generated by the light triggering pulse passing through the light fiber cable 8 so that the light permeability may be improved. The electrode 5 is an electrode for short-circuiting the n+ cathode 7 and first base layer 2 with each other. The electrode 9 also short-circuits the $n^{30}$ cathode 1 and first base layer 2 with each other in a part not shown in the drawing. Both of the n+ region 7 receiving the irradiation of the light triggering pulse and n+ region 1 are cathode regions of the thyristor shown in FIG. 1. It is shown in this thyristor that the cathodes 7 and 1 are short-circuited with the first base 2. By thus short-circuiting the n+ cathode regions 7 and 1 with the first base layer 2, the surface potentials of the n+ cathode regions 7 and 1 and of the p base region 2 are kept the same. The light triggering operation shall be explained in the following.

By the base resistance voltage drop until the carriers generated by the light flow through the base layer 2 and reach the base electrode 5 or 9, a potential distribution is produced within the base layer 2. The part through which the electrons of the cathodes 7 are most likely to flow is the base layer part just below the n+ cathode region 7. The electrons slightly flowing out of the n+ cathode region 7 flow out also to the anode 4 side together with the recombination within the base 2 and run through the n region 3 to be accumulated near the np(+) junction between it (3) and the anode p(+) region 4. Thereby, positive holes are injected into the n region 3 from the anode p(+) region 4 and the electrons flow mostly through the first base layer 2 and reach the base electrode 5 or 9. Thereby, the base resistance voltage drop within the base layer 2 is further produced and further more electrons flow out of the n+ cathode region 7 receiving the light irradiation and further the n+ cathode region 1 not receiving the light irradiation until the thyristor is turned-on. A constant resistance is inserted between the n+ region 7 and base layer 2 so as to compensate any misoperation produced at the time of triggering the light in the thyristor but, in the operation of the conventional type light triggering thyristor, utilizing the base resistance drop within the first base layer 2 is a fundamental operation. However, in turning-off, the voltage of the anode and cathode is reversed by using an electrically commuting circuit or a structure of turning-off the gate wherein parts for electrically turning-off the gate are integrated on the same chip is generally utilized.

On the other hand, the light triggering operation of a static induction thyristor (SIThy) different in the operation principle from the above described thyristor by the base resistance control and turning-on and -off by controlling the potential barrier within the channel by the static induction effect has been already suggested by the present inventor and is disclosed in Japanese patent applications Nos. 95585/1976 (laid-open No. 20885/1978) and 150300/1982 (laid-open No. 40576/1984). A method wherein a gate circuit including a photosensitive element is inserted between the first gate and cathode of the conventional static induction thyristor and the static induction thyristor is turned-off by the light irradiation to this photosensitive element has been also already suggested and is disclosed in Japanese patent application No. 36079/1979 and laid open No. 128870/1980. As compared with the thyristor of the conventional type pnpn structure shown in FIG. 1, the static induction thyristor has features that, as the potential barrier control within the channel is utilized, the frequency is not limited by the base resistance, the speed can be easily made high and the area can be made large and, as the carriers run at a high speed through the high resistance channel region, even the forward voltage drop is so small as to be less than 1.6 V at the current density of $10^3 A/cm^2$ and further has an operation of sucking out at a high speed the carriers within the channel to the gate electrode by the drifting electric field existing between the gate and channel at the time of turning-off and therefore high speed turning-off is possible.

The already practiced or suggested matters regarding the light triggering or light quenching operation shall be summarized as follows. In the conventional type pnpn structure thyristor or gate turn-off thyristor, the light triggering operation is carried out as explained in FIG. 1 but the light quenching operation by the gate is not carried out. Generally, turning-off is electrically made by commutative circuit inserted between the anode and cathode. Regarding the static induction thyristor, only with respect to a single gate structure, the light triggering is disclosed in the above described Japanese patent application Nos. 95585/1976 and 150300/1982 and the light quenching is disclosed in the above described Japanese patent application No. 36079/1979.

However, in the embodiment disclosed in the Japanese patent application No. 36079/1979, the light pulse driving the single-gate type SI thyristor is not irradiated directly on the thyristor but is irradiated on the photosensitive element in the external circuit connected to the gate and the quenching light pulse drives the external circuit. That is to say, the impedance of the photosensitive element of the external circuit is varied with the light pulse and thereby the current source voltage applied to the gate of the SI thyristor is varied to be strong or weak to thereby trigger or quench the light in the SI thyristor. On the other hand, there is also a method wherein, in the conventional type pnpn structure thyristor, a pin photodiode as a kind of commutative circuit is connected between the anode and cathode and the light triggering operation is carried out by irradiating the triggering light directly on the thyristor as in FIG. 1 and the light quenching operation is carried out by irradiating the quenching light on the pin photodiode connected between the anode and cathode. This method is published by P. Roggwiler et al in the International Electron Devices Meeting, 1980 on p. 646. However, in this method, the area of the light quenching photodiode must be made so large as to make the anode current flow, the speed is comparatively slow and the efficiency is also low.

In the conventional type pnpn structure thyristor or the gate turn-off thyristor, the reason why the light quenching operation by the optical gate turn-off process is not made is thought to be because the time constant of turning-off becomes long due to the base resistance within the first base layer but is due to the great defect that, as the carriers accumulated in the junction part of the second base layer 3 and anode region 4 are vanished by their flow out into the anode region 4 or their recombination with the positive holes injected from the anode region 4, the time constant of turning-off becomes long. This is the same also in the light quenching operation of the static induction thyristor of a single gate structure. Further, the presence of a base resistance within the first base layer in the thyristor of the conventional type pnpn structure substantially reduces the sensitivity to the light. In the case of the light triggering and quenching operation by connecting the external circuit which includes the light sensitive element between the first base 2 and cathodes 7 and 1 and controlling the impedance of the external circuit with the light, the internal impedance of the thyristor represented by the base resistance becomes a factor of remarkably reducing the efficiency of the light triggering and quenching operation. Therefore, it is thought that, for the reason that the gate resistance is very small, the static induction thyristor is better in the light triggering and quenching sensitivity. It has not been industrially practiced to turn-on or -off the direct current with only the light. In order to perfectly separate the high power and control circuits from each other with the light, the direct current must be turned-off with the light. In the conventional type pnpn structure thyristor or the gate turn-off thyristor, the current is electrically turned-off using the commutative circuits and, in the single gate type static induction thyristor, too, the time constant of turning-off is determined by the time constant of vanishing the carriers accumulated between the second base and anode the same as in the light quenching operation. The time constant of turning-off of the light triggered thyristor of the conventional pnpn structure is comparatively so long as to be several hundred $\mu$ sec.

SUMMARY OF THE INVENTION

An object of the present invention is to provide a thyristor device which can turn on-and-off a direct current with only a light.

More concretely, one of the objects of the present invention is to provide a thyristor device wherein, in a single gate type static induction thyristor or single base type beam base thyristor, an electrode is taken on the second base, a function of pulling away carriers accumulated in the first gate and in the second base through photosensitive elements connected outside are provided respectively, the first light pulse is irradiated directly on the thyristor to turn it on and the impedance of the photosensitive element of the external circuit is reduced by the second light pulse so as to pull away the accumulated carriers respectively from the first base and second base to quench (turn-off) the thyristor.

Another object of the present invention is to provide a thyristor device wherein, in a double gate type static induction thyristor, photosensitive elements are connected respectively to the first gate and second gate as external circuits, the thyristor is turned on by the first light pulse, the impedances of the photosensitive elements of the external circuits of the first and second gates are reduced by the second light pulse so as to pull away the carriers accumulated in the first gate and in the second gate to quench (turn-off) the thyristor.

Further, another object of the present invention is to provide a structure wherein the above mentioned photosensitive element parts are integrated within the same semiconductor substrate as of the thyristor.

Further concretely, one of the objects of the present invention is to provide a thyristor device wherein a gate circuit including an SIT high in the photosensitivity or SIT-mode bipolar transistor is connected to the gate or base part of a single gate type SI thyristor or single base type beam base thyristor, the light triggering pulse is irradiated directly on the thyristor part to turn it on and the light quenching pulse is irradiated directly on the SIT- or SIT-mode bipolar transistor to turn it on to turn on and off the direct current with only the light.

A further object of the present invention is to provide the above mentioned thyristor device wherein a thyristor (beam base thyristor) can be triggered and quenched by using the light characterized in that the electroconductive type of the channel is reversed which the other electroconductive type of the static induction thyristor remains the same. The operation principle of the thyristor having this beam base structure is that, the same as in the static induction thyristor, the main current flowing through the p or n base region comparatively lower in the impurity density of the beam structure $p^+pp^+p$ . . . or $n^+nn^+n$ . . is controlled by the capacitance combination by the base potential of the $p^+$ or $n^+$ base region comparatively higher in the impurity density. That is to say, the same operation as of the static induction thyristor is made in respect that the potential of the p or n base region is controlled by the static induction by the potential of the $p^+$ or $n^+$ base region and that the main current flowing through the p or n base region is controlled by the potential barrier control of the p or n base region. It is natural that not only the single base type but also the double base structure exists in this beam base thyristor. The beam base thyristor by the electric on-off operation is already disclosed by one of the present inventors in the Japanese Journal of Applied Physics Vol. 16, Supplement 16-1, pp 541-544, 1977.

Further, another object of the present invention is to provide such beam base thyristor device on a single base and double base type which can be triggered and quenched by the light.

Another object of the present invention is to provide a light triggerable and light quenchable thyristor device wherein a beam base structure or SIT gate structure is adopted respectively in the first base or first gate and in the second base or second gate.

The present inventors have found that, in a method of turning-on and -off a direct current with only a light by using a thyristor, in the case of using two light pulses so that the thyristor may be driven to be turned-on by the first light pulse and may be turned-off by driving the external circuit of the gate or base by the second pulse, the triggering operation and quenching operation can be made efficiently at a high speed by using a static induction phototransistor in the external circuit. These two light pulses are not independent of each other but are correlated with each other in a series of light triggering and light quenching operations of the thyristor. The time constant of turning-off the light triggered thyristor of the conventional pnpn structure is in the order of several hundred $\mu$ sec., whereas the time constant of turning-off at the time of the light quenching operation of the thyristor device according to the present invention is in the order of $\mu$ sec. in the light quenchable thyristor device. Even in the light quenchable thyristor device using a single base type beam base thyristor, the time constant is in the order of $\mu$ sec. Further, in the light quenchable thyristor device using a double gate type SI thyristor or double base type beam base thyristor, it is less than 1 $\mu$ sec.

There are single gate type and double gate type static induction thyristors. In the single gate type, the gate structure near the cathode is an SIT gate structure but the anode side is of a base structure and takes no electrode. In the double gate type, both first gate and second gate are of SIT gate structures. As described above, there is a beam base structure as a formation realizing the same operation as of the SIT gate structure. In the beam base structure, in a predetermined part within the base, for example, within a plane substantially vertical to the direction in which the main current flows if the base is a p base, there is provided a distribution of such non-homogeneous base impurity regions as p+pp+p. Such modification as a structure in which the p+ region is embedded within the p base, a plane (planar) beam base structure and an incised (recessed) beam base structure are possible The p+ region within the base is formed to be mesh-shaped, lattice-shaped or stripe-shaped in the form enclosing the p region within the base and the potential of the p region is selected to be of such dimensions and impurity density as are controlled in the static capacitance by the potential of the p+ region. It is formed that, with such formation, as compared with the case of a uniform (homogeneous) base, the base resistance is lower, the frequency characteristic improved and the sensitivity to the light and the gain at the time of turning-off are remarkably improved. The SIT gate structure or SIT mode beam base structure operating with the same static induction effect as of the SIT gate structure has features that particularly the sensitivity to the light is very high and, contrary to the characteristics of the conventional uniform (homogeneous) base structure, the lower the light intensity, the higher the sensitivity. On the cathode side, the region in which the carriers generated by the light are accumulated is the p+ gate or p+ base part in which the impurity density is high but the electrons from the cathode flow through the intrinsic gate point or through the low potential part of the intrinsic base point, the potential of the intrinsic point or intrinsic base point as seen from the cathode is lower than the potential barrier height between the p+ gate or base and n+ cathode when the carriers accumulated by the light flow into the cathode and therefore overwhelmingly many electrons are injected into the channel.

The maximum value of the optical gain of the direct current when the gate (base) is opened is given approximately by $$G_{max} \simeq \frac{n_K v_n}{p_G v_p} [\exp(V_{biGK} - V_{biG^*K})] \tag{1}$$

where $n_K$ and $p_G$ represent the impurity densities respectively of the cathode and p+ gate (p+ base), $v_n$ represents the average velocity at which the electrons injected from the cathode pass over the potential barrier, $v_p$ represents the velocity generally the diffusing velocity at which the carriers accumulated in the p+ gate or p+ base pass out into the cathode, $V_{biGK}$ represents the potential barrier between the p+ gate (base) and cathode and $V_{biG^*K}$ represents the potential barrier height between the cathode and intrinsic gate point or intrinsic base point. It is found that the exponential term in the formula (1) can be of a very large value. The exponential term in the formula (1) shows a great feature of the current gain of the SIT gate structure or the SIT mode beam base structure.

On the other hand, a feature of such SIT gate structure high in the photosensitivity or the SIT-mode beam base structure is that the turn-off gain can be taken to be large. The reason for the turn-off gain being taken to be large is that, for example, in the first gate or first base region, at the time of turning-off, the accumulated carriers near the p+ gate region or p+ base region will be pulled out of the p+ gate region or p+ base region and, as the potential of the p+ gate or p+ base region becomes higher, due to the static induction effect, the potential of the intrinsic gate point or intrinsic base point will also rise and the gate will be turned-off. The time constant at the time of turning-off depends on both of the time constant for which the accumulated carriers within the first gate or the first base and discharged through the external gate circuit and the time constant for which the accumulated carriers within the second gate or second base vanish. In the case of the SIT gate structure or the SIT-mode beam base structure, the internal gate resistance shows a much smaller value than in the case of the conventional type thyristor and, even if the area of the element becomes larger and the capacitance part of the gate or base becomes larger, if the resistance part of the external circuit is made smaller, the thyristor will be able to be turned-off at a very high speed. The single gate SI thyristor or the single base type beam base thyristor of the same characteristics is simple in the element structure and is therefore easy to make. On the other hand, the structure complicated but capable of a high speed operation is the double gate type or double base type SI thyristor or beam base thyristor structure wherein the SIT gate structure or SIT-mode beam base structure is introduced into the first gate or first base region on the cathode side and the same SIT gate structure or beam base structure is introduced into the second gate or second base region on the anode side.

It is found that, in the SI thyristor or beam base thyristor, the time constant of turning-off can be made faster by reducing the external resistance part of the gate or base, therefore such phototransistor very high in the photosensitivity as the static induction transistor (SIT) is connected to the gate or base electrode and the light is irradiated from a fiber or the like on this static induction phototransistor (SIPT) to reduce the impedance and the external resistance part of the thyristor so that the light quenching operation may be possible. In the light triggering operation, the SIT gate structure of the above mentioned SI thyristor or beam base thyristor or the high photosensitivity of the SIT-mode beam base structure is utilized and, in the light quenching operation, the light is irradiated on the SIT very high in the photosensitivity and connected to the gate or base region of the thyristor to reduce the on-resistance so that the thyristor may be turned-off by the light at a very high speed. It is evident that, when a bipolar transistor (called also a punching-through bipolar transistor) having the above described SIT-mode beam base structure is used instead of the SIT of the external gate or base circuit the same characteristic of the light quenching operation will be obtained. Such SIT-mode bipolar transistor is likely to be used in integrating within the same substrate the SI thyristor or beam base thyristor and the light quenching transistor. Therefore, the light quenchable thyristor device of the present invention has an important part of the invention the formation wherein at least one of the SIT gate structure and SIT-mode beam base structure is applied to the first gate region, first base region, second gate region or second base region of the thyristor and one of the main electrodes of the static induction transistor or SIT-mode bipolar transistor is connected to the electrode part of the gate or base region to which the above mentioned structure is applied.

Only with such formation, the direct current can be turned-off by only the light (optical gate-turn-off) and the high power and control circuits can be perfectly separated from each other.

In the present invention, two light pulses are required in addition to the thyristor and SIT or SIT-mode bipolar transistor in the above mentioned important part. One is a triggering light pulse for the thyristor and the other is a quenching light pulse for the SIT or SIT-mode bipolar transistor. Usually, for the light source, a light emitting diode or semiconductor laser can be used but a lamp or the like may be also used depending on the use. Also, various optical fibers may be used to introduce the light pulse into the thyristor. It is also effective to use a plurality of optical fibers to diffuse and emit the light pulse over the entire surface of the thyristor. Otherwise than irradiating the triggering light pulse over the entire surface of the thyristor, there is naturally also a system wherein an auxiliary thyristor of an area of about the diameter of one optical fiber is integrated on the same substrate and the auxirialythyristor is triggered by the light to turn-on the main thyristor.

The thyristor device according to the present invention utilized the high photosensitivity of the SIT gate structure or SIT-mode beam base structure. In the thyristor part, the SIT gate structure or SIT-mode beam base structure exists in the first gate or base region or second gate or base region and therefore the switching efficiency at the time of the triggering operation is very high. In the case of the single gate type SI thyristor, such values as of a turning-on delaying time of 1.9 sec. and a turning-on rising time of 380 n sec. are obtained with the thyristor of a class of 600V and 10A.

On the other hand, the sensitivity to the light of the SIT or SIT-mode bipolar transistor connected to the gate or base region is very high as described above. Therefore, the excess carriers existing at the turned-on state near the SIT gate structure part or beam base structure part within the thyristor are pulled out through the highly photosensitive SIT or SIT-mode bipolar transistor together with the large turning-off current gain owned by the thyristor itself and therefore the turning-off operation of the thyristor of the present invention can be made at a speed much higher than the turning-off time of 100 $\mu$ sec. of the conventional light triggered thyristor. In the case of the single gate type SI thyristor of the class of 600V and 10A, the turning-off time is several $\mu$ sec. as measured by using such circuit formation connecting the p channel type SIT to the gate as is shown in the later described FIG. 2A and the operation waveforms shown in FIGS. 2B and 2C. In the double gate or double beam base thyristor structure or the thyristor structure in which one is an SIT gate structure and the other is a beam base structure and when an SIT or SIT-mode bipolar transistor is connected to both gate or base regions is adopted, the turn-on time and turn-off time will be able to be made less than 1 $\mu$ sec.

There are advantages that, when the thyristor device according to the present invention is used, if it can turn-on and -off the direct current by the light, even not only the SI thyristor but also the conventional type thyristor or gate turn-off thyristor will do and the high power and control circuits will be able to be perfectly separated from each other. The present invention is very high in the utility value in the device for converting the direct current of a large electric power to an alternating current and is also high in the industrial value in developing a new application to use of a large electric power.

BRIEF DESCRIPTION OF THE DRAWINGS

FIG. 5 is a circuit diagram showing further another embodiment of the present invention by a double gate SI thyristor.

FIG. 6A and 7A are circuit diagrams showing further other embodiments by single gate SI thyristors.

FIG. 6B and 7B are circuit diagrams showing further other embodiments by double gate SI thyristors.

DESCRIPTION OF THE PREFERRED EMBODIMENTS

The embodiments of the present invention shall be explained in the following with reference to the drawings.

Figure 2A:
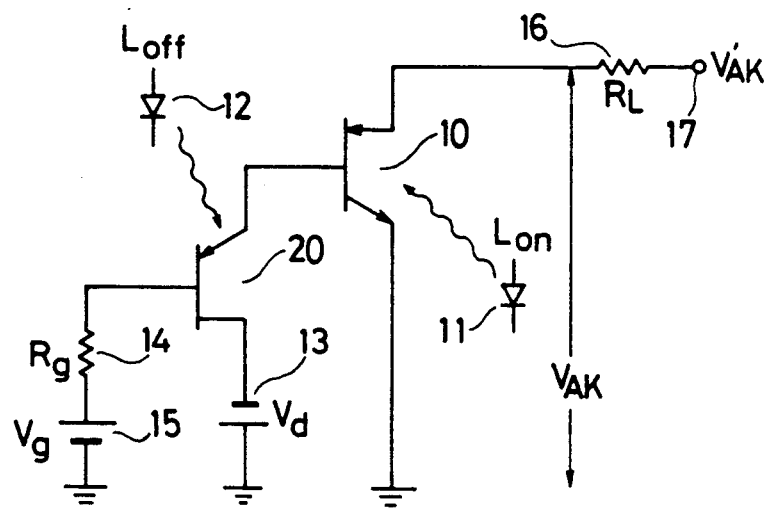
FIG. 2A is a circuit diagram showing an embodiment of the light triggered and light quenched thyristor device of the present invention by a single gate SI thyristor.
Figure 2B:
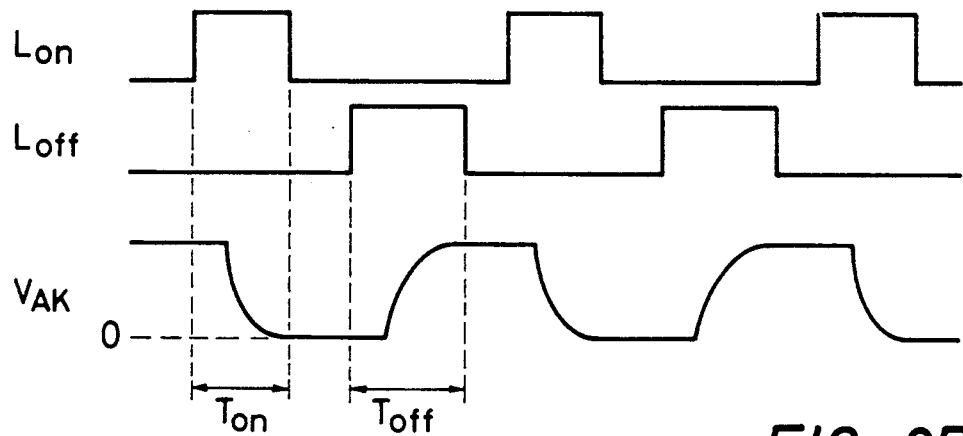
FIG. 2B is a view of operation waveforms used in the device in FIG. 2A.

FIG. 2A shows a circuit diagram of the light triggering and light quenching operations of a single gate type thyristor by the invention of the present application, Reference numeral 10 represents a single gate type SI thyristor in which the anode is biased by a voltage source 17 (of a voltage $V'_{AK}$) through a load resistor 16 (of a resistance value $R_L$) and the cathode is connected to ground. The source of a normally-on type p-channel SIT 20 is connected to the gate of the single gate type SI thyristor 10. The gate of the normally-on type p-channel SIT 20 is biased to be positive by a voltage source 15 (of a voltage $V_g$) through a gate resistor 14 (of a resistance value $R_g$) and the drain is biased to be negative by a voltage source 13 (of a voltage $V_d$). FIG. 2B shows a timing chart of driving waveforms of a light $L_{on}$ from an LED 11 for turning-on the thyristor, driving waveforms of a light $L_{off}$ from an LED 12 for turning-off the thyristor and waveforms of a voltage $V_{AK}$ between the anode and cathode of the single gate type SI thyristor 10 in the case of making the operations of turning-on and -off the thyristor in the circuit formation in FIG. 2A. When no light is incident on either of the single gate type SI thyristor 10 or the normally-on type p-channel SIT 20 in FIG. 2A, the gate normally-on type p-channel SIT 20 will be biased to the voltage $V_g$ through the resistor 14 and the normally-on type p-channel SIT 20 will be off. If the resistance between the source and drain of the normally-on type p-channel SIT 20 at this time is $R_{off}$(p-SIT), the gate of the single gate type SI thyristor 10 will be biased by the negative voltage $V_d$ through the resistance $R_{off}$(p-SIT) and the single gate type SI thyristor 10 will be off. Here, the negative voltage $V_d$ is so hard to be effectively applied to the gate of the single gate type SI thyristor 10 that, in the circuit formation in FIG. 2A, in the operation using such LED driving pulse as is shown in FIG. 2B, for the single gate type SI thyristor 10, the normally-off type SI thyristor is more pertinent than the normally-on type.

If the external resistance (the resistance $R_{off}$) (p-SIT) in this case) of the single gate type SI thyristor 10 is high, and when the anode voltage $V_{AK}$ is elevated, the positive holes generated in the void layer with the SI thyristor and the positive holes flowing in from the anode side will accumulate in the gate, the potential of the gate for the electrons will reduce, the electrons injected from the cathode side will increase and the thyristor 10 will break over. On the other hand, the larger the external resistance of the gate, the higher the photosensitivity of the single gate type SI thyristor 10. Therefore, the voltage source 13, $V_d$, resistor 14, $R_g$, and voltage source 15, $V_g$, are so selected that the resistance $R_{off}$(p-SIT) may be so small as not to break over from the single gate type SI thyristor against the maximum forward blocking voltage $V_{AK(max)}$ at the time of the operation and may be of a value so large as to well turn them on with the light $L_{on}$ from the LED used to turn-on the thyristor. Also, the negative bias voltage $V_d$ by the voltage source 13 is so selected that a gate voltage so high as to be able to block the maximum forward blocking voltage $V_{AK(max)}$ may be applied to the gate of the single gate type SI thyristor 10. The larger the resistance $R_g$, the higher the photosensitivity of the normally-on type p-channel SIT 2 but the lower the responding speed. Therefore, the value of the resistance $R_g$ is selected in consideration of the intensity of the light $L_{off}$ from the LED 12 for turning off the thyristor.

While the single gate type SI thyristor 10 is off, if the light $L_{on}$ from the LED 11 for turning-on is incident upon the single gate type SI thyristor 10, the positive holes of the carriers produced in pairs by the light within the single gate type SI thyristor 10 will accumulate in the gate of the single gate type SI thyristor 10, the potential of the intrinsic gate for the potential on the cathode side will reduce, the electrons of the carriers produced in pairs will accumulate in the second base and the potential of the second base for the positive holes on the anode side will reduce. As a result, the electrons injected from the cathode and the positive holes injected from the anode side will increase, their carriers will reduce the potentials of the intrinsic gate and second base and therefore the SI thyristor will turn on. As described above, the current amplifying factor and photosensitivity of the SIT gate structure are so high that the SI thyristor 10 can be turned-on with a low light intensity. Even if the light $L_{on}$ from LED 11 for turning on the thyristor is cut after being turned-on once, the carriers will continue to be injected from the anode and cathode and therefore the single gate type SI thyristor 10 will remain on.

The pulse width $T_{on}$ and light intensity P of the light $L_{on}$ from the LED for turning-on the single gate type SI thyristor 10 depend much on the photosensitivity of the single gate type SI thyristor 10.

Now, when the light $L_{off}$ from the LED 12 for turning-off is incident upon the normally-on type p-channel SIT 20, if the electron current flowing to the gate of the p-channel SIT 20 of the electrons generated by this incident light $L_{off}$ is represented by $i_{nphg}$, the potential of the gate of the p-channel SIT 20 will reduce by $i_{nphg} \times R_g$ and the impedance between the source and drain of the p-channel SIT 20 will reduce. Thereby, the negative bias $V_d$ will come to be effectively added to the gate of the single gate type SI thyristor and, the positive holes accumulated in the gate of the single gate type SI thyristor 10 will be quickly pulled out through the p-channel SIT 20, the potential of the intrinsic gate point for the electrons of the cathode will become so high as to control the injection of electrons from the cathode. Further, the electrons accumulated in the second base will recombine with the positive holes flowing in from the anode side or will flow out to the anode side to vanish and therefore the injection of the positive holes from the anode will be also controlled.

Thus the single gate type SI thyristor 10 is turned-off. If the gate current of the SI thyristor 10 when the single gate type SI thyristor 10 is turned-off is represented by $i_g$, the internal resistance of the gate of the single gate type SI thyristor 10 is represented by $r_g$ and the resistance to turning-on between the source and drain at the time when the light $L_{off}$ from the LED for turning-off is incident upon the normally on type p channel SIT 20 is represented by $R_{on}$ (p-SIT), a voltage drop of $i_g$ ($R_{on}$(p-SIT)+$r_g$) will be generated. Due to this voltage drop, the single gate type SI thyristor 10 will become hard to turn-off. It is one of the merits that inherently the SI thyristor is so low in the gate resistance as to be able to be electrically turned-off. Therefore, in order to turn-off a large electric current at a high speed, the resistance $R_{on}$(p-SIT) is desired to be as small as possible but, as described above, the photosensitivity of the SIT is very high and the resistance to turning-on is small.

Even if the light $L_{off}$ from the LED 12 for turning-off is quenched, the potential of the single gate type SI thyristor 10 will be high enough to check the injection of electrons from the cathode side, therefore the electrons will not accumulate in the second base, the potential of the second base will be high enough to check the injection of positive holes from the anode side and therefore the single gate type SI thyristor 10 will remain off.

The pulse width, $T_{off}$, and intensity P of the light $L_{off}$ from the LED for turning-off required to turnoff the single gate type SI thyristor 10 depend much on the photosensitivity of the normally-on type p-channel SIT 20.

By the method explained above, the single gate type SI thyristor 10 can be turned-on and -off.

Figure 2C:
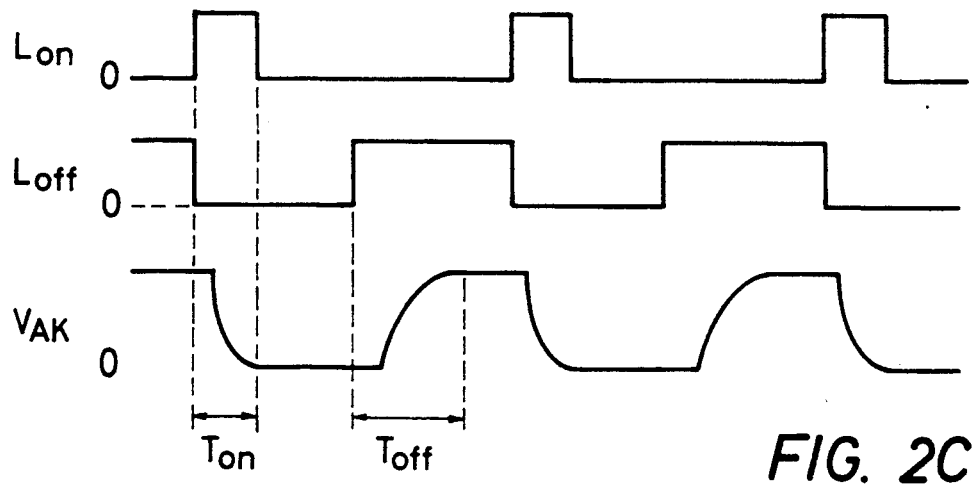
FIG. 2C is a view of other operation waveforms used in the device in FIG. 2A.

FIG. 2C shows other operation waveforms of the timing chart of the light $L_{on}$ from the LED 11 for turning on and the light $L_{off}$ from the LED 12 for turning-off for the operations of turning-on and -off with the circuit formation in FIG. 2A and also the voltage waveform $V_{AK}$ between the anode and cathode of the single gate type SI thyristor 10 then. The difference from FIG. 2B is that, while the single gate type SI thyristor 10 is off, the light $L_{off}$ from the LED for turning-off will continue to be incident upon the normally-on type p-channel SIT 20. Therefore, the light pulse width from the LED for turning-off must be longer than the light pulse width $T_{off}$ from the LED 12 for turning-off required to turn-off the thyristor but higher dv/dt and di/dt and high photosensitivity characteristics will be obtained.

In the operation example in FIG. 2C, in case the light $L_{off}$ from the LED for turning-off is incident upon the normally-on type p-channel SIT 20 and the light $L_{on}$ from the LED for turning-on is cut, the normally-on type p-channel SIT 20 will be on and the gate of the single gate type SI thyristor 10 will be biased to the voltage $V_d$ through the on-resistance $R_{on}$ (p-SIT). The resistance $R_{on}$(p-SIT)+$r_g$ will be so small that the voltage $V_d$ of the voltage source 13 will be effectively added to the gate of the single gate type SI thyristor 10, the breaking over characteristics in the above described dark current state will no longer appear and the voltage between the anode and cathode will be able to be blocked. At this time, the SI thyristor 10 may be either of the normally-on type and normally-off type and the value of the voltage $V_d$ may be determined in response to the characters of the SI thyristor 10.

Now, if the light $L_{off}$ from the LED 12 for turning-off is cut and the light $L_{on}$ from the LED for turning-on is incident upon the single gate type SI thyristor 10, the normally-on type p-channel SIT 20 will be off, the gate of the single gate thyristor 10 will be biased with the negative voltage $V_d$ of the voltage source 13 through the off-resistance $R_{off}$ (p-SIT) of the normally-on type p-channel SIT 20, therefore the potential of the gate of the single gate type SI thyristor 10 will become lower and the photosensitivity will become higher.

At this time, as the breaking over characteristic of the SI thyristor 10 need not be taken into consideration, the resistance $R_{off}$(p-SIT) between the source and drain while the normally-on type p channel SIT 20 is off will be desired to be made as high as possible to improve the photosensitivity.

On the other hand, the light $L_{on}$ from the LED 11 for turning-on will be incident on the single gate type SI thyristor 10 and the single gate type SI thyristor 10 will be easily turned-on. Once it is turned-on, even if the light $L_{on}$ from the LED 11 for turning on is cut, carriers will continue to be injected from the cathode and anode and the thyristor 10 will be kept turned-on. The transition to be off is made by the same process as of the operation in FIG. 1B.

Figure 1:
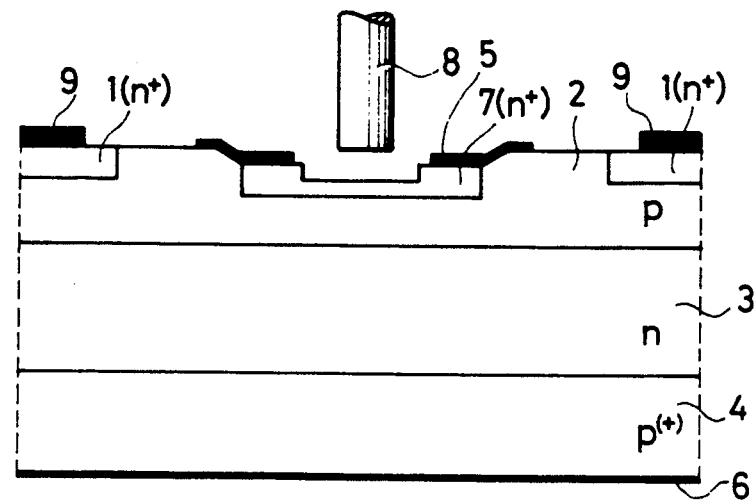
FIG. 1 is a sectioned view of an element structure near the part on which a triggering light is irradiated of the sectioned structure of a light triggered thyristor of a conventional pnpn four layer structure.
Figure 3:
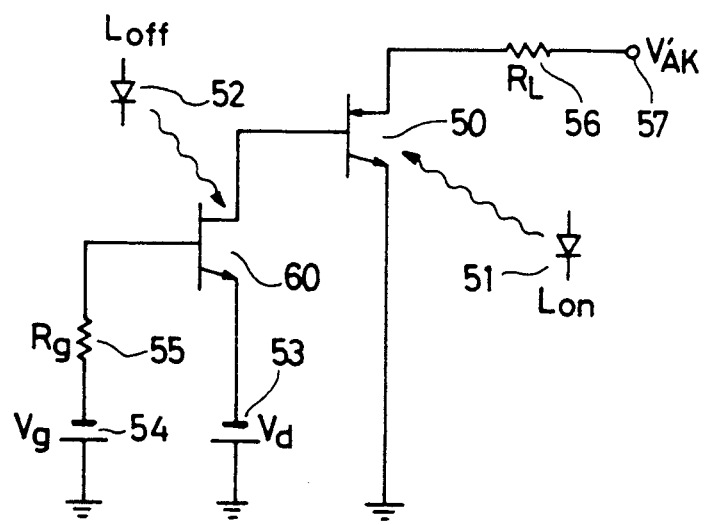
FIG. 3 is a circuit diagram showing another embodiment of the light triggered and light quenched thyristor device of the present invention by a single gate SI thyristor and n-channel SIT.

FIG. 3 shows a circuit formation in which the normally-on type p-channel SIT 20 of the circuit formation shown in FIG. 1A is replaced with a normally-on type n-channel SIT 60. The drain of the normally-on type n-channel SIT 60 is connected to the gate of the single gate type SI thyristor 50 and the voltage source 53 is connected to add the negative voltage $V_d$ to the source of the normally-on type n-channel SIT 60. The gate of the normally-on type SIT 60 is connected to the current source 54 through the resistor 55 having the resistance $R_g$ and is biased with the negative voltage $V_g$. The driving waveforms of the light $L_{on}$ from the LED 51 for turning-on and the light $L_{off}$ from the LED 52 for turning-off are the same as in the timing charts shown in FIGS. 2B and 2C. The operation principle is substantially the same as is explained with reference to FIGS. 2A to 2C but there is a difference that, in the process wherein the positive holes accumulated in the gate of the single gate type SI thyristor will vanish when the single gate type SI thyristor which is on changes to be off, the positive holes are pulled out through the normally-on type p-channel SIT 20 in the embodiments in FIGS. 2A to 2C, whereas the electrons flow into the gate of the SI thyristor 50 through the normally-on type n-channel SIT 60 and recombine with the positive holes accumulated in the gate of the single gate type SI thyristor 50 in the embodiment in FIG. 3.

Figure 4A:
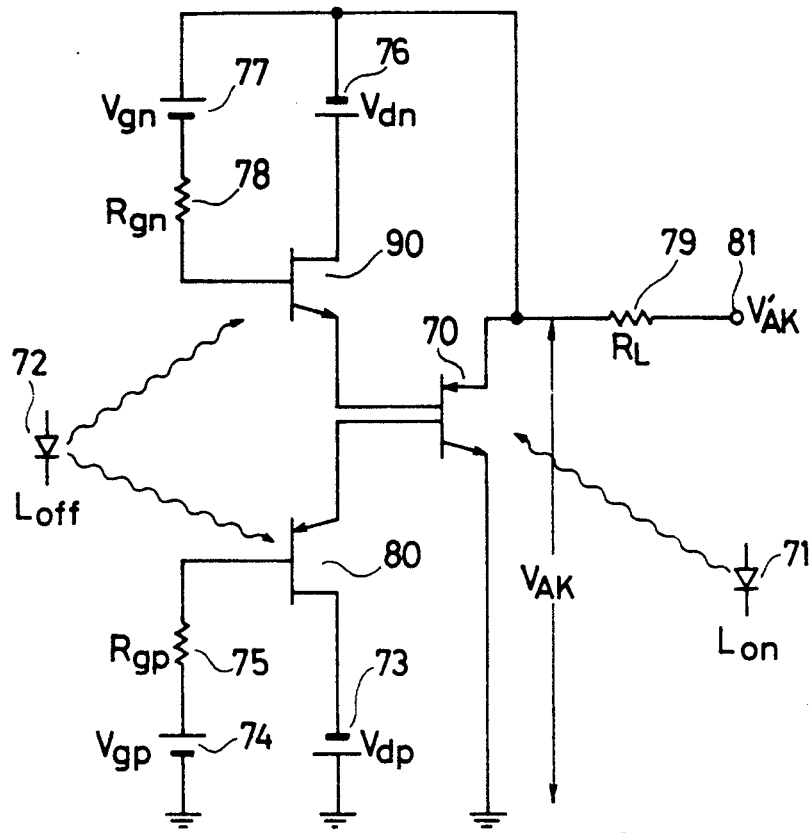
FIG. 4A is a circuit diagram showing further another embodiment of the light triggered and light quenched thyristor device of the present invention by a double gate SI thyristor.
Figure 4B:
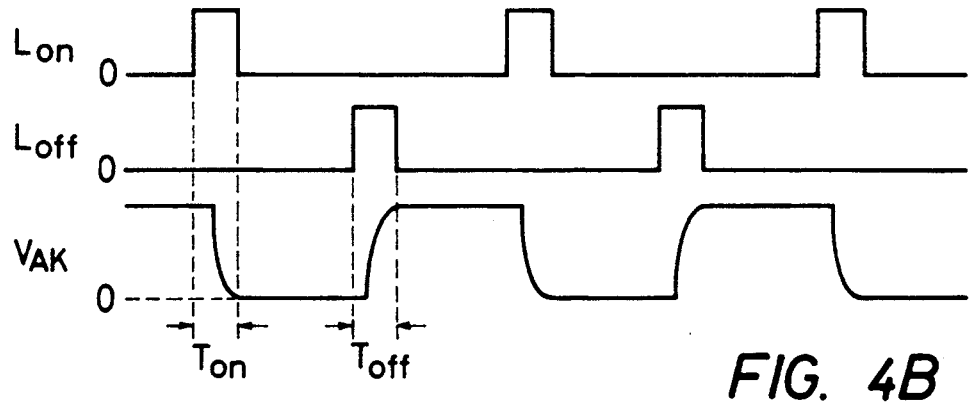
FIG. 4B is a view of operation waveforms used in the device in FIG. 4A.
Figure 4C:
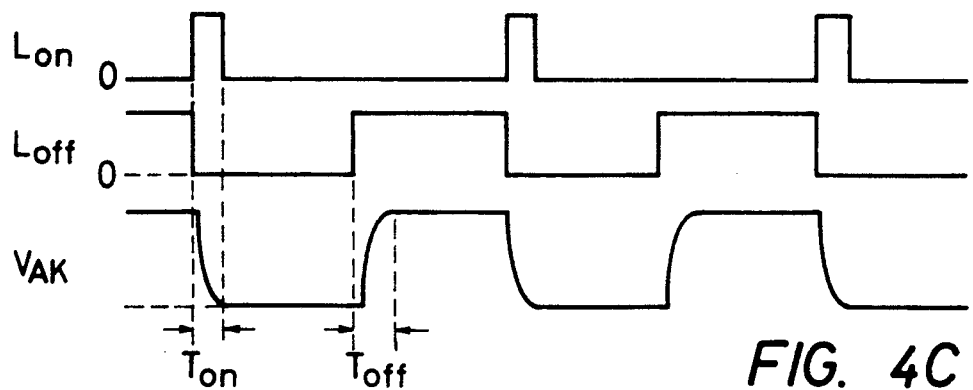
FIG. 4C is a view of other operation waveforms used in the device in FIG. 4A.

FIG. 4A shows an embodiment in the case of making the operation of turning-on and -off a double gate type SI thyristor using light. The anode of the double gate type SI thyristor 70 is biased with the voltage $V'_{AK}$ through the resistor 79 having the load resistance $R_L$ and the terminal 81. The first gate and second gate of the double gate type SI thyristor 70 are connected respectively to the source of the normally-on type p-channel SIT 80 and the source of the normally-on type n-channel SIT 90. The gate of the normally-on type p-channel SIT 80 is biased with a positive voltage $V_{gp}$ by the current source 74 through the resistor 75 having the resistance $R_{gp}$ and the negative voltage $V_{dp}$ is added to the drain by the current source 73. The gate of the normally-on type n-channel SIT 90 is connected with the anode of the double gate type SI thyristor 70 through the current source 77 and the resistor 78 having the resistance $R_g$ so as to be biased with the negative voltage $V_{gn}$ and the drain is connected with the anode of the double gate type SI thyristor through the voltage source 76 so as to be biased with the positive voltage $V_{dn}$. FIGS. 4B and 4C show timing chart of the driving waveforms of the light $L_{on}$ from the LED 71 for turning on and the light $L_{off}$ from the LED 72 for turning off and the waveforms of the voltage $V_{AK}$ between the anode and cathode of the double gate type SI thyristor 70. The light $L_{on}$ from the LED 71 for turning-on is incident upon the double gate type SI thyristor 70 and the light $L_{off}$ from the LED 72 for turning-off is incident upon the normally-on type p-channel SIT 80 and the normally-on type n-channel SIT 90.

The embodiment in FIG. 4A and the operation when the LED driving waveforms in FIG. 4B are used are fundamentally the same respectively as the above mentioned embodiment in FIG. 1A and the operation when the timing chart in FIG. 1B. However, in the double gate type SI thyristor 70, the SIT gate(first gate) of the single gate type SI thyristor is also formed the anode side as the second gate, so that high gains are obtained in both of the first gate and second gate, therefore the photosensitivity is very high and the time $T_{on}$ of turning-on the thyristor becomes short. Further, when the light is off, the carriers will be pulled out in both of the first gate and second gate and therefore the time $T_{off}$ of turning off the thyristor will be shorter. The normally-on type p-channel SIT 80 connected to the first gate of the double gate type SI thyristor 70 in the embodiment in FIG. 4A performs the same role as of the normally-on type p-channel SIT 20 in the embodiment in FIG. 2A. The normally-on type n-channel SIT 90 connected to the second gate will be of the low resistance $R_{on}$(n-SIT), will pull the electrons out of the second gate of the double gate type SI thyristor 70, will elevate the potential for the positive holes on the anode side of the second gate and will control the injection of the positive holes when the light $L_{off}$ from the off-LED 72 is incident and will be of the high resistance $R_{off}$(n-SIT) and will accumulate the electrons generated by the light $L_{on}$ from the on-LED 71 in the depletion layer of the double gate type SI thyristor 70 in the second gate of the double gate type SI thyristor 70 when the light $L_{off}$ from the off-LED 72 is cut.

The embodiment in FIG. 4A and the operation using the LED driving waveforms shown in FIG. 4C are fundamentally the same respectively as the embodiment in FIG. 2A and the operation using the LED driving waveforms shown in FIG. 2C.

FIG. 5 shows an embodiment in which the normally-on type p-channel SIT 150 is used instead of the normally-on type n-channel SIT 90 in the embodiment in FIG. 4A. Besides, there are thought to be an embodiment in which the normally-on type n-channel SIT is used instead of the normally-on type p-channel SIT 80 in the embodiment in FIG. 4A and an embodiment in which the normally-on type n-channel SIT and normally-on type p-channel SIT are used instead respectively of the normally-on type p-channel SIT 80 and normally-on type n-channel SIT 90 in the embodiment in FIG. 4A. Any of these embodiments can be operated with the LED driving operation waveforms shown in FIGS. 4B and 4C.

FIG. 6A shows an embodiment in which the normally-off type p-channel SIT 170 is used instead of the normally-on type p-channel SIT 20 in FIG. 2A. FIG. 6B shows an embodiment in which the normally-off type p-channel SIT 190 and normally-off type n-channel SIT 200 are used instead respectively of the normally-on type p-channel SIT 80 and normally-on type n-channel SIT 90. As the normally-off type p-channel SIT's 170 and 190 and normally-off type n-channel SIT 200 can be operated with the gates open, the circuit formations become simple. There are thought to be embodiments using the normally-off type SIT's for all the embodiments using the above described normally-on type SIT's. They can be operated with the same LED driving waveforms.

Figure 7A:
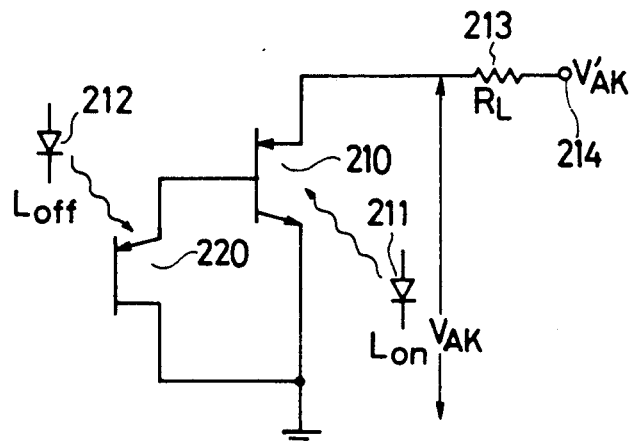
Figure 7B:
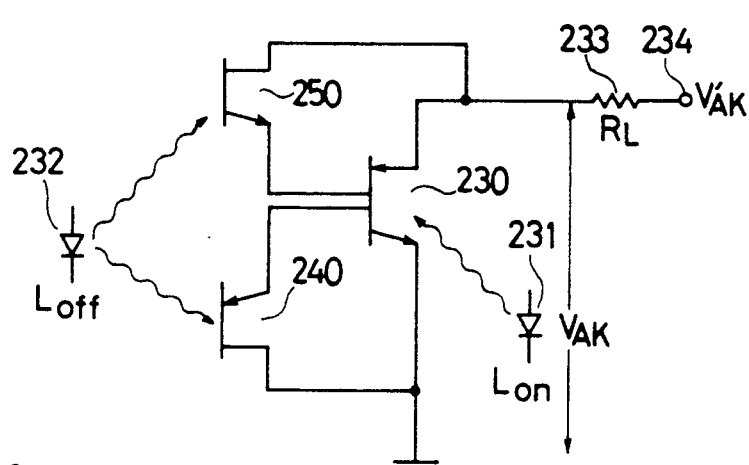

FIG. 7A shows an embodiment of the light on-off operating circuit of the normally-off single gate type SI thyristor requiring on other current source voltage than the anode voltage. The gate of the single gate type SI thyristor 210 is connected to the ground through the normally-off type p-channel SIT 220. While the light $L_{off}$ from the LED 212 for turning-off is incident upon the normally-off type p-channel SIT 220, the gate of the single gate type SI thyristor 210 is connected to the ground through the on-resistance $R_{on}$ (n-off-p-SIT) of the normally-off type p-channel SIT 220. In order to be off in this state, the single gate type thyristor 210 must be an SI thyristor requiring the normally-off character. The driving waveforms of the light $L_{on}$ from the LED 211 for turning-on and light $L_{off}$ from the LED 212 for turning-off are the same as in FIGS. 2B and 2C. The normally-off type p-channel SIT 220 in FIG. 7A may be a normally-off type n-channel SIT. FIG. 7B shows an embodiment of the light on-off operating circuit of the normally-off double gate type SI thyristor 230 requiring no other source voltage than the anode voltage. The first gate of the double gate type SI thyristor 230 is connected to the ground through the normally-off type p-channel SIT 240. The second gate is connected to the anode of the double gate type SI thyristor 230 through the normally-off type n-channel SIT 250. For the reason explained in the embodiment in FIG. 7A, the double gate type SI thyristor 230 must have a normally-off characteristic. The driving waveforms of the light $L_{on}$ from the LED 231 for turning-on and the light $L_{off}$ from the LED 232 for turning-off are the same as are shown in FIGS. 4B and 4C. The normally-off type p-channel SIT 240 in FIG. 7B may be a normally-off type n-channel SIT. Also, the normally-off type n-channel SIT 250 may be a normally-off type p-channel SIT.

Figure 8:
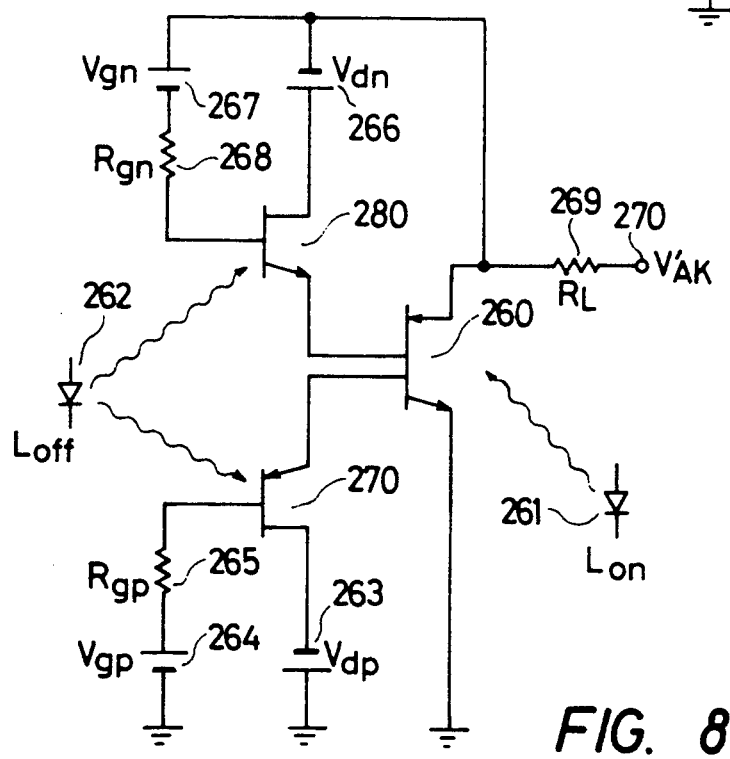
FIG. 8 is a circuit diagram showing further another embodiment of the present invention using a double base type beam base thyristor.

FIG. 8 shows further another embodiment of the present invention. In this embodiment, the light triggering and quenching operation circuit of the double base type beam base thyristor 260 is shown. In this case, the operation waveforms of the light $L_{on}$ from the light triggering LED 261 and the light $L_{off}$ from the light quenching LED 262 are the same as are shown in FIGS. 4B and 4C. The normally-on type p-channel SIT 270 is connected to the first base of the thyristor 260 and the normally-on type n-channel SIT 280 is connected to the second base. The bias current source 266, 263, 267 and 264 and gate resistors 268 and 265 have respectively the same roles of the bias current sources 76, 73, 77 and 74 and resistors 78 and 75. The great difference of this embodiment from the embodiment in FIG. 4A is that the double gate type SI thyristor 70 in FIG. 4A is replaced with the double base type beam base thyristor 260. Both of the first base and second base of the thyristor 260 are of the SIT mode beam base structures.

Figure 9:
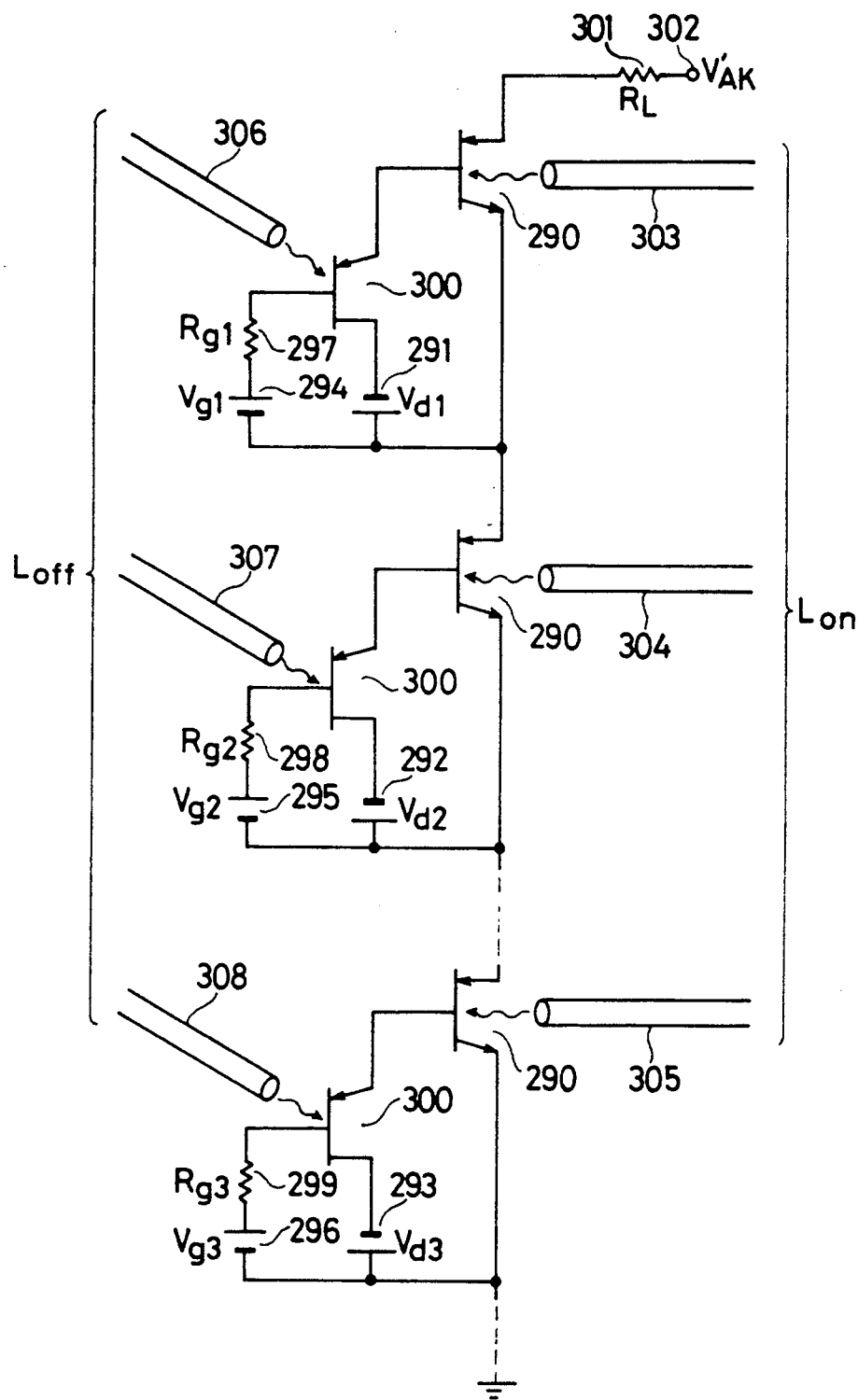
FIG. 9 is a circuit diagram showing an embodiment in which the embodiments in FIG. 2A are connected in series.
Figure 10:
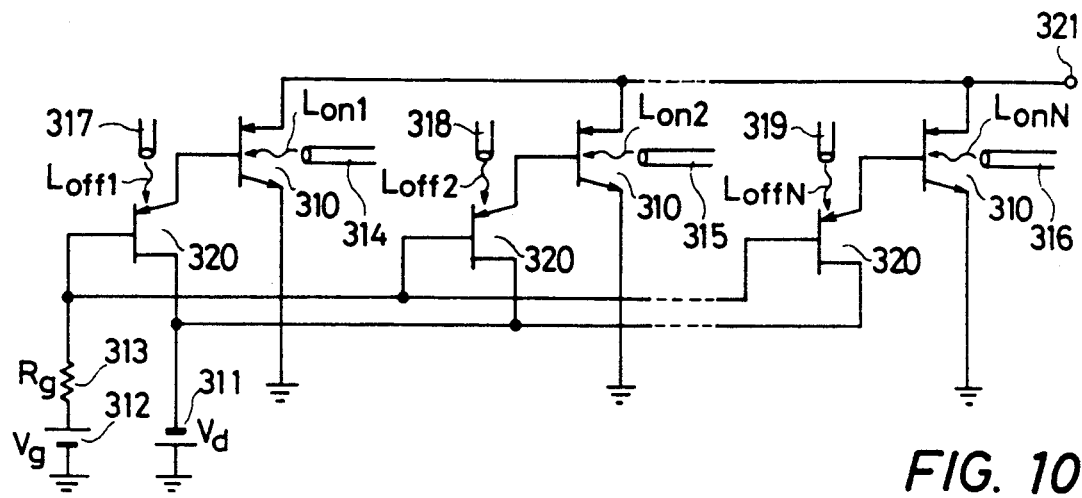
FIG. 10 is a circuit diagram showing an embodiment in which the embodiments in FIG. 2A are connected in parallel.

FIGS. 9 and 10 show embodiments wherein a plurality of the above described SIT thyristors or beam base thyristors are connected respectively in series or in parallel so as to be able to make the light triggering and quenching operations of a large voltage and current. The thyristors may be connected naturally in series or in parallel A protective commuting circuit for preventing the large voltage or current from being added to a specific thyristor may be connected between the anode and cathode of each thyristor. As described above, the formation of the light triggered and quenched thyristor device may be of the SI thyristor of not only the single gate structure but also the double gate structure or of the beam base thyristor of the single base or double base structure. The gate circuit forming transistor may be the p-channel or n-channel SIT or SIT-mode bipolar transistor. If it is the normally-off transistor, the gate circuit will become simpler.

FIG. 9 shows an embodiment wherein a plurality of formation units of the single gate type SI thyristor 290 and normally-on type p-channel SIT 300 are connected in series. The optical fibers 303, 304 and 305 are to introduce triggering light pulses into the SI thyristors so that the triggering LED light $L_{on}$ may be substantially simultaneously radiated onto the respective thyristors 290. The optical fibers 306, 307 and 308 are to introduce the quenching light pulses into the light quenching SIT's 300 so that the light quenching LED light $L_{off}$ may be substantially simultaneously radiated onto the respective SIT's 300. The embodiment in FIG. 9 operates the same as the embodiments explained in FIGS. 2A to 2C. The values of the drain bias voltages $V_{d1}$, $V_{d2}$ and $V_{d3}$ respectively by the voltage sources 291, 292 and 293 to the SIT's 300 may be substantially the same. In the same manner, the values of the gate resistances $R_{g1}$, $R_{g2}$ and $R_{g3}$ respectively by the resistors 297, 298 and 299 may be also substantially the same. The values of the gate bias voltages $V_{g1}$, $V_{g2}$ and $V_{g3}$ respectively by the current sources 294, 295 and 296 may be also substantially the same. On the other hand, in order to regulate the fluctuations of the characteristics of the respective SIT's 300, the respective voltage values of the gate resistors 297, 298 and 299, gate bias voltage sources 294, 295 and 296 and drain bias voltage sources 291, 292 and 293 may be adjusted.

FIG. 10 shows an embodiment in which the circuit forming units explained with reference to FIG. 2A are connected in parallel and which will be carried out in the case of handling a large current. The important part is formed of the SI thyristor 310 and normally-on type p-channel SIT 320. The gate bias voltage source 312 is parallelly connected to the respective SIT's 320 through the drain bias voltage source 311 and gate resistor 313. The optical fibers 314, 315 and 316 are to introduce the triggering light pulses into the thyristors 310. The optical fibers 317, 318 and 319 are to introduce quenching light pulses into the SIT's 320. A large current can be light-triggered and light-quenched by using the operation waveforms explained in FIGS. 2B and 2C.

FIGS. 11A to 16 show structural embodiments of the light triggered and quenched thyristor device according to the present invention, characterized by an integrated structure of the single gate or double gate type SI thyristor or single base or double base type beam base thyristor and the SIT or SIT-mode bipolar transistor connected to the first base (gate) or second base (gate).

Figure 11A:
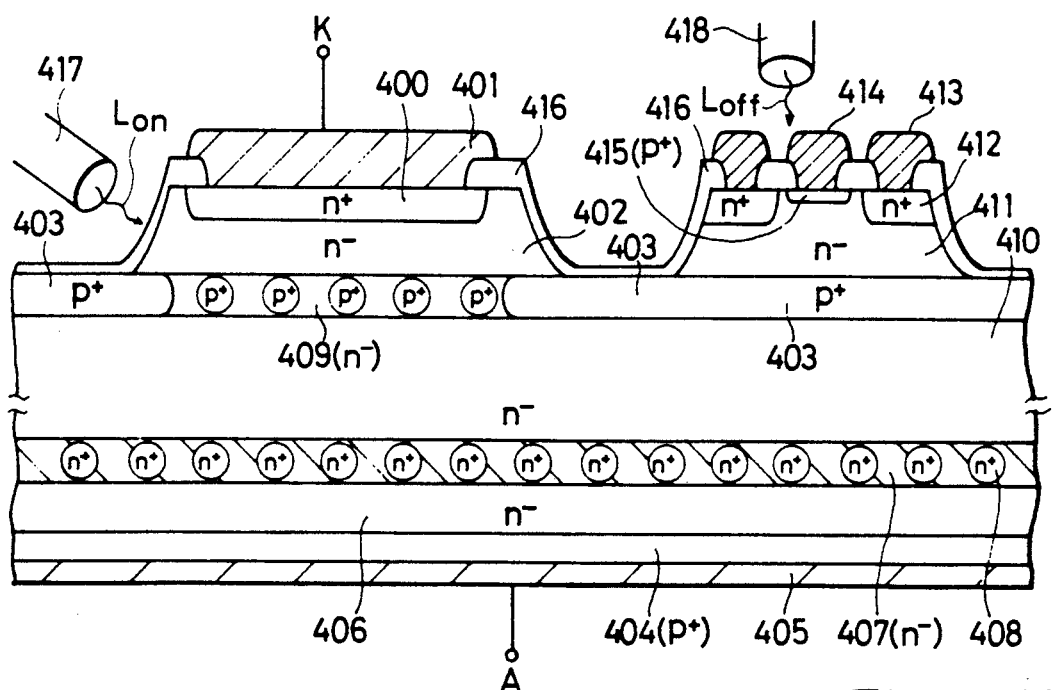
FIG. 11A is a sectioned structure view of an embodiment of the element according to the present invention using a single gate type SI thyristor.

FIG. 11A shows a structure integrating the single gate type SIT thyristor and SIT-mode bipolar transistor. For the operation circuit, there can be applied the circuit in which, in FIGS. 2A, 6A and 7A, the p-channel SIT's 20, 170 and 220 are replaced with the pnp bipolar transistors. The operating method is the same as is made with reference to FIGS. 2A to 2C. The operation waveforms shown in FIGS. 2B and 2C can be applied. In FIG. 11A, the p+ region 403 represents a thyristor buried gate layer and is made common with the emitter region of the pnp bipolar transistor. The n+ region 400 represents a thyristor cathode region. 401 represents a cathode electrode. The n− layer 402 is made a high resistance layer to secure the breakdown voltage between the gate layer 403 and cathode 400. The n− region 409 is the channel region of the thyristor. On the other hand, the p+ region 404 is the anode region of the thyristor. 405 represents the anode electrode. The n− high resistance layers 406, 407 and 410 and a beam base layer is formed between it and the n− high resistance layer 407. The positions of the beam base layers 407 and 408 are set to be near the anode p+ region 404. In the embodiment in FIG. 11A, the n+ base region 408 is made to float. As a matter of course, the single gate type SI thyristor, the beam base structure formed of the above described n high resistance layer 407 and n+ buried layer is not indispensable but may be replaced with the n− high resistance layers 410 and 406. The collector region of the SIT-mode bipolar transistor is the p+ region 415 and the n+ region 412 and n− region 411 are the base regions. The n− layer 402 and n− 411 are simultaneously formed. 413 represents the base electrode and 414 represents the collector electrode. In order to improve the permeability of the light quenching light pulse $L_{off}$ with the optical fiber 418, the doped polysilicon or transparent electrode is more preferable than the Al electrode. The wavelength of the light is so selected that the generating place of the electron− hole pairs generated by the light quenching light pulse $L_{off}$ may be limited to be substantially within the n− region 411. On the other hand, the light triggering light pulse $L_{on}$ introduced by the optical fiber 417 is so contrived as to be introduced from the bevel part of the thyristor or particularly the bevel part between the gate and cathode in FIG. 11A.

In the light triggering operation of the SI thyristor, it is desirable that both electron⁻ hole pairs generated by the light triggering light pulse $L_{on}$ contribute to the turning-on operation. If the electron⁻ hole pairs are generated by the light triggering pulse $L_{on}$ within the n⁻ high resistance layer, the positive holes will be accumulated within the first gate region or particularly the p+ region 403 and the electrons will be accumulated within the n+ region of the second base region. The potential of the n⁻ region 409 will gradually reduce due to the static induction effect by the positive holes accumulated in the p+ region 403, the injection efficiency of electrons from the n+ cathode region 400 will increase, on the other hand, the potential of the n base region 407 for the positive holes of the anode p+ region 404 will also reduce due to the static induction by the electrons accumulated in the n+ base region 408 and the probability of injection of positive holes will increase. Therefore, the wave length of the light triggering light pulse $L_{on}$ is desired to be of such penetration depth as can reach the interior of the n⁻ layer 410 or the n⁻ regions 409 and 402 near the p+ gate region. When the above mentioned beam base structures 408 and 407 are provided in the second base region, the injection efficiency of positive holes from the anode p+ region will be higher. In case the n+ region 408 is not provided, the base structure will be uniform but the current amplifying factor will be lower than in the SI mode beam base structure. The region 416 is an insulator layer. 405 represents an anode electrode.

Figure 11B:
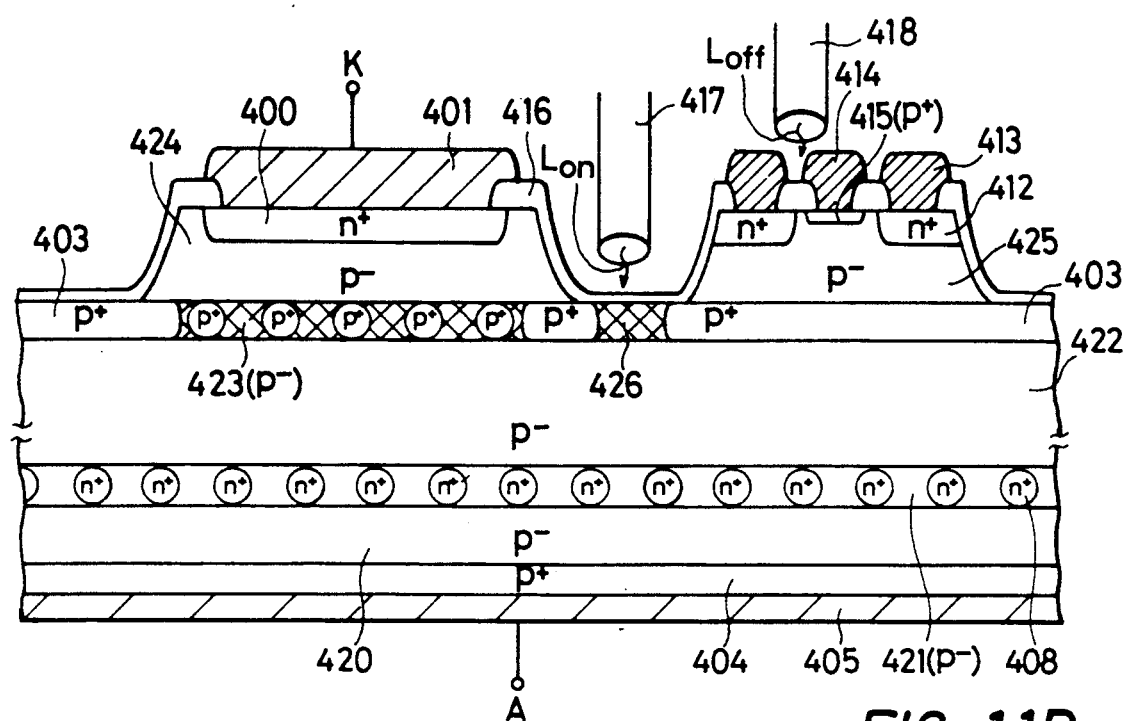
FIG. 11B is a sectioned structure view of an embodiment of the element according to the present invention using a single base type beam base thyristor.

FIG. 11B shows a structure of integrating the single beam base thyristors and inverted operation SIT's. The operation circuit and operating method are the same as in the embodiment in FIG. 11A. The structural differences, from the embodiment in FIG. 11A are that the n⁻ high resistance regions 402, 409, 410, 407, 406 and 411 are replaced respectively with the p⁻ high resistance regions 424, 423, 422, 421, 420 and 425 and that the light triggering light pulse $L_{on}$ introduced by the optical fiber 417 is emitted to the p⁻ high resistance layer 426 through the insulator region 416 and p⁻ high resistance layer 426. The optical fiber 417 is set just in the part in which the gate cathode part of the beam base thyristor and the SIT part are separated from each other. The p+ region 403 is made common with the source region of the p-channel SIT. The p+ region 415 is the drain region. The n+ region 412 is the gate region. p+ layer 425 is the channel region. 413 and 414 represent respectively the gate electrode and drain electrode of the SIT. The n+ region 408 is the buried layer. The SIT gate structure as the second gate is formed between it and the n⁻ layer 421. In the embodiment in FIG. 11B, there are obtained substantially the same operation and characteristic as of the embodiment in FIG. 11A.

Figure 11C:
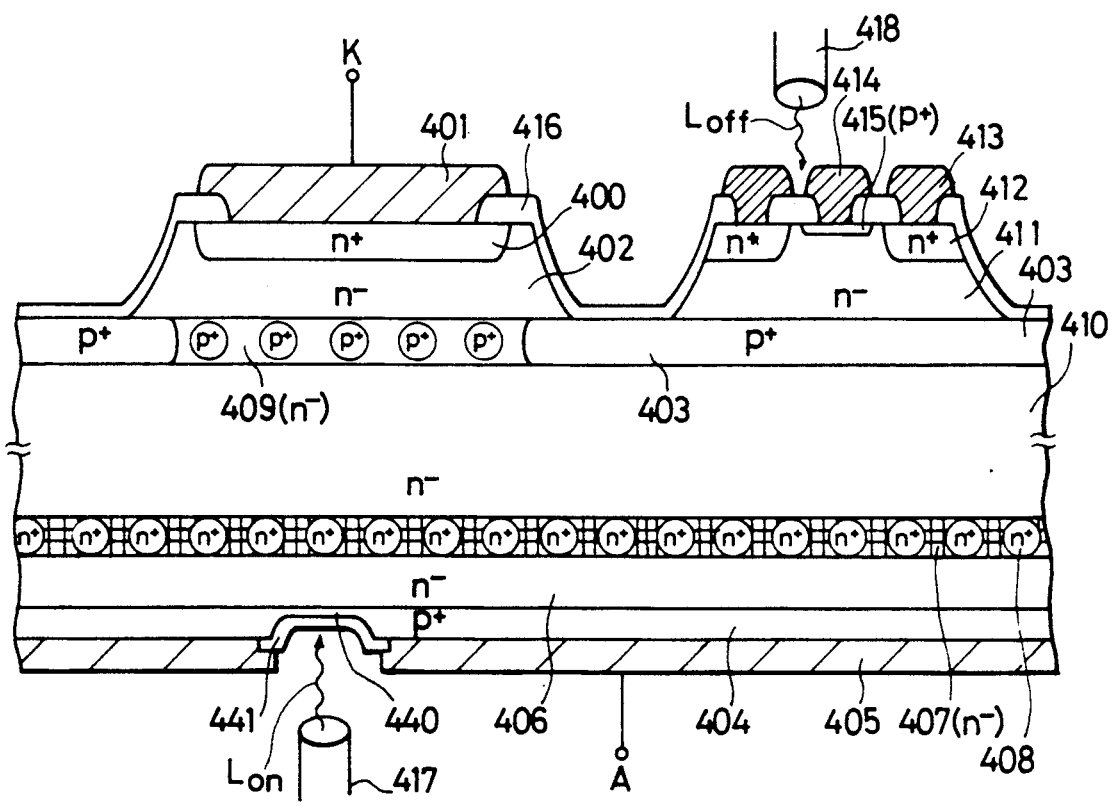
FIG. 11C is a sectioned structure view of another embodiment of the element according to the present invention using a single gate type SI thyristor.

FIG. 11C shows an embodiment wherein the optical fiber 417 for introducing the light triggering light pulse $L_{on}$ is provided on the anode side in the embodiment of the integrated structure consisting of the single gate type SI thyristor and SIT-mode pn⁻ p bipolar transistor in FIG. 11A. The part of the p+ region 440 of the anode p+ region 404 is etched to be thin so that the light pulse $L_{on}$ of the optical fiber 417 may be efficiently emitted through the insulator layer 441.

Figure 15:
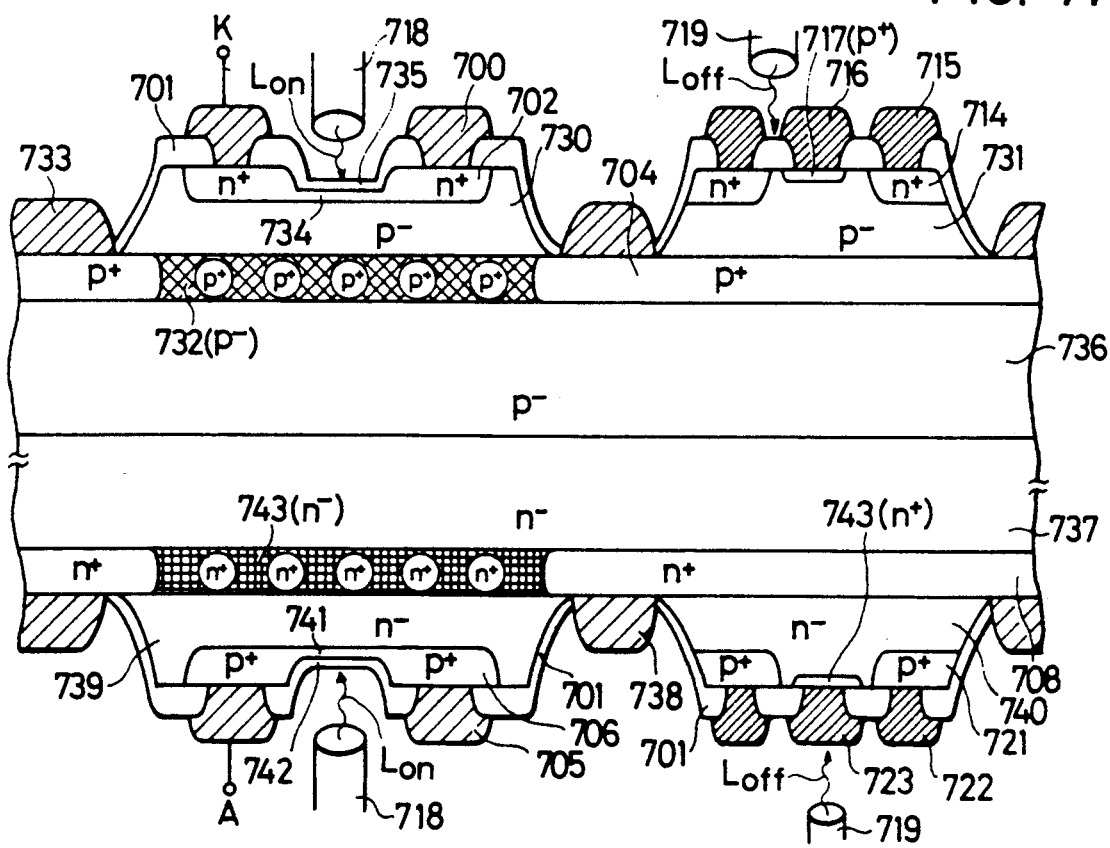
FIG. 15 is a sectioned structure view of an embodiment of the element according to the present invention using a double base type beam base thyristor.

The embodiments shown in FIGS. 11A to 11C are exemplifications. As shown in FIG. 15, a thin n+ layer is provided in the form of a step in the part of the cathode n+ region in FIG. 11C and the light fiber may be made to emit the light to that part. Further, in FIGS. 11A to 11C, the SIT-mode beam base structure or SIT gate structure need not be particularly provided in the second base region or second gate region but the n⁻ or p⁻ high resistance layer region may remain as it is. Or an n layer having a pn junction with the p+ anode layer 404 may be provided.

Figure 12A:
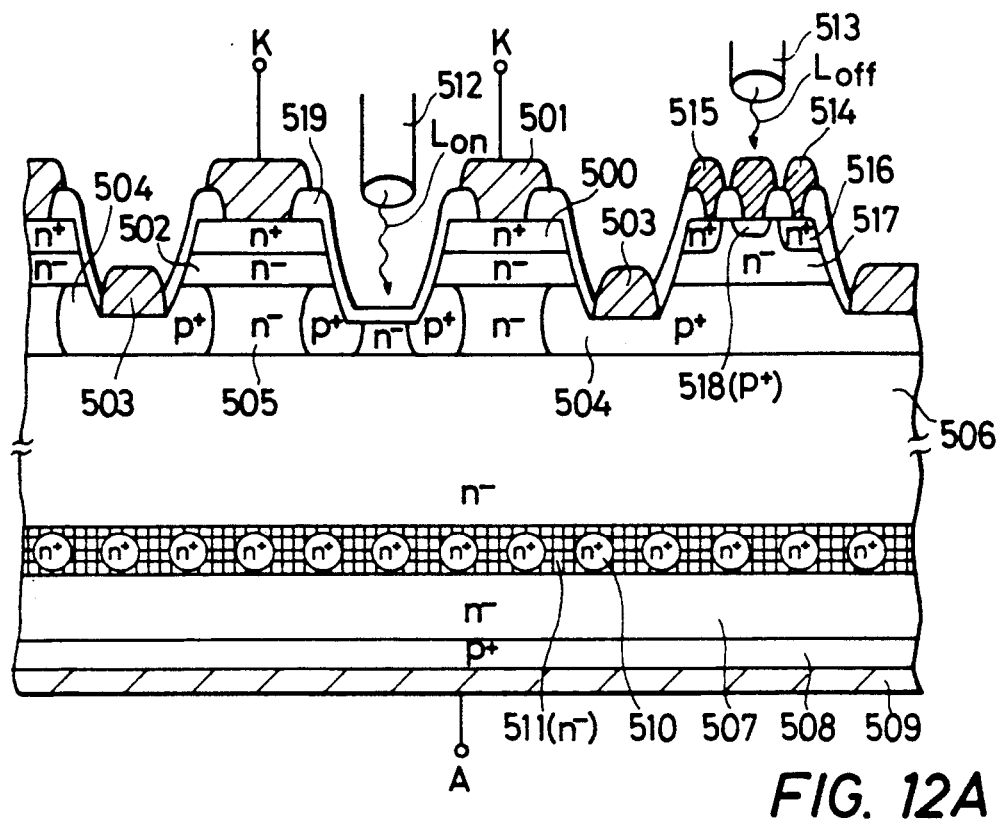
FIG. 12A is a sectioned structure view of an embodiment of the element according to the present invention using a single gate type SI thyristor having a step gate structure.
Figure 12B:
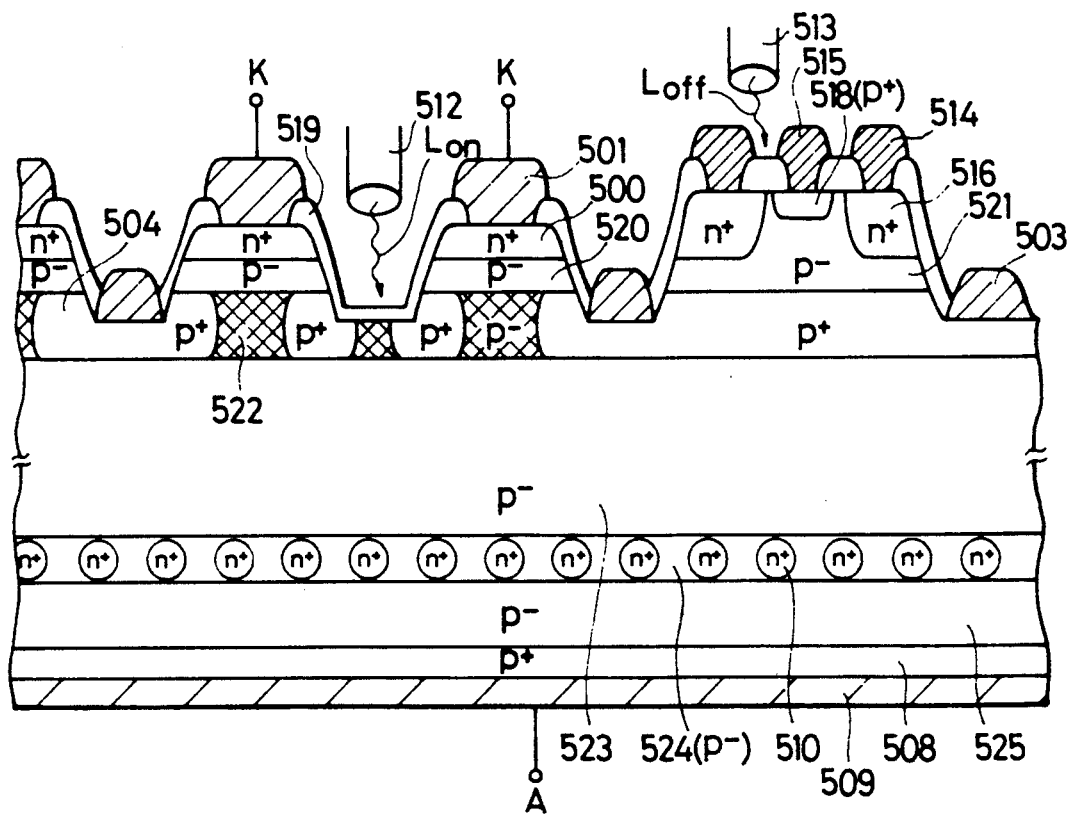
FIG. 12B is a sectioned structure view of an embodiment of the element according to the present invention using a single base type beam base thyristor having a step base structure.

FIG. 12A and 12B show other structural embodiments of the present invention. The first gate or beam base region is the buried gate or buried beam base in FIG. 11 but is the recessed gate or recessed beam base in FIGS. 12A and 12B. The gate electrode 503 is attached to the recessed part in the p+ gate region 504 so as to reduce the gate resistance. The light triggering pulse $L_{on}$ introduced by the optical fiber 512 enters the high resistance layers 502, 505 and 506 from the step part as illustrated and therefore the light, absorbing efficiency is high. FIG. 12A shows an integrated structure consisting of the single gate type SI thyristor including the beam base structures 510 and 511 made to float in the second base region and the SIT-mode p+n⁻ p+ bipolar transistor. The electrode parts 501, 503, 509, 514 and 515 represent respectively the cathode electrode, thyristor gate electrode, anode electrode, bipolar transistor base electrode and collector electrode. The optical fibers 512 and 513 are respectively to introduce the light triggering light pulse $L_{on}$ and light quenching light pulse $L_{off}$. The n+ region 500 represents the cathode region and the p+ region 508 represents the anode region. The p+ region 504 is the first gate region of the thyristor and the n⁻ region 505 is the high resistance channel region. The breakdown voltage between the gate and cathode can be elevated by the n⁻ layer 502. The p+ region 504 is simultaneously the emitter region of the bipolar transistor. The p+ region 518 is the collector region and the n+ region 516 and n⁻ region 517 represent the base layers. The n⁻ high resistance layer 506 is the region to perform the breakdown voltage between the anode and cathode of the thyristor. The second beam base layer of the SIT-mode is provided in the part near the anode by the n+ region 510 and n⁻ region 511. This second beam base layer is made to be of a floating potential The n⁻ layer 507 is the region for voltage blocking between the n+ second base and anode. The operation circuit and operating method of this embodiment are the same as of the embodiments shown in FIGS. 11A to 11C.

FIG. 12B shows another embodiment close to the integrated structure in FIG. 12A. In FIG. 12B, the single base type beam base thyristor having the SIT gate made to float in the second gate region and the p channel SIT are integrated. In this embodiment, the n⁻ high resistance layer regions 502, 505, 506, 511, 507 and 517 in FIG. 12A are replaced respectively with the p⁻ high resistance layer regions 520, 522, 523, 524, 525 and 521. The difference from the embodiment in FIG. 12A is that the diffusion depth of the n+ gate region 516 of the SIT part is larger than the diffusion depth of the n+ cathode region 500. The p region 521 represents the channel region of the SIT, the p+ region 504 represents the high impurity density base region of the beam base thyristor and, at the same time, the source region of the SIT. The p+ region 518 is the drain region. 514 and 515 represent respectively the gate electrode and drain electrode of the SIT. It is natural that the potential of the p⁻ layer can vary due to the static induction effect by the potential of the n+ gate region 510.

Each of the embodiments shown in FIGS. 11A to 12B, can be turned-off by pulling out the positive holes accumulated in the first gate region or first base region through the bipolar transistor of the SIT-mode or the SIT of the p-channel but can be also turned-off by only pulling out the electrons accumulated in the second gate region or second base region through the bipolar transistor of the SIT-mode or the n− channel SIT.

Figure 13A:
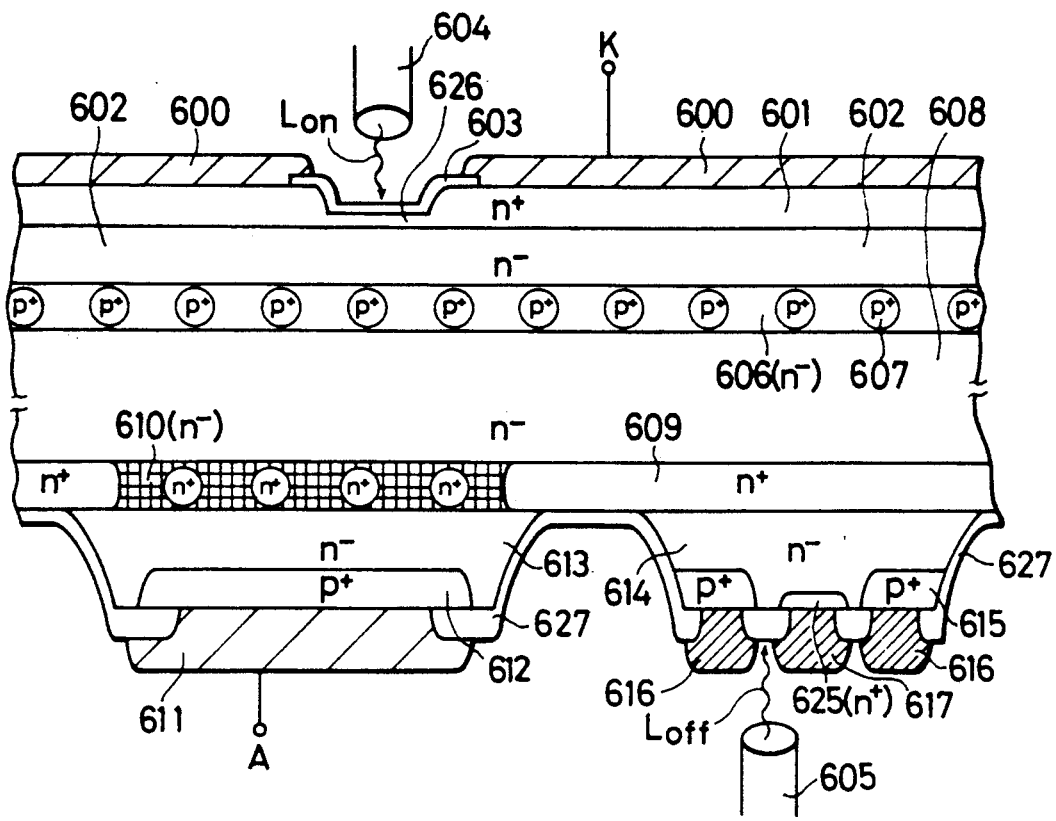
FIG. 13A is a sectioned structure view of another embodiment of the element according to the present invention using a single base type beam base thyristor.
Figure 13B:
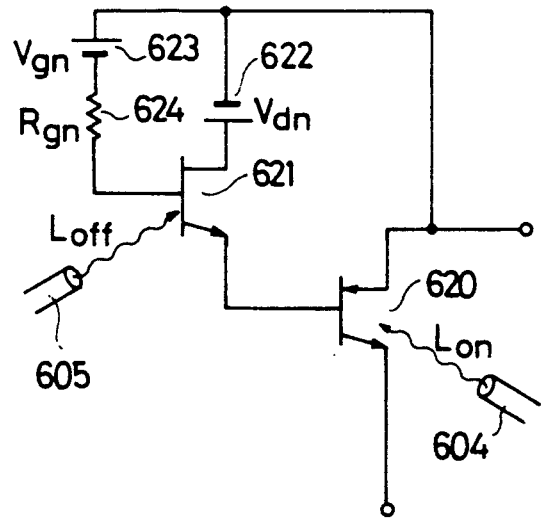
FIG. 13B is an operation circuit diagram for the element shown in FIG. 13A.

FIGS. 13A and 13B show embodiments of such a thyristor device. The embodiment of the integrated structure of the single base type beam base thyristor 620 having the SIT gate structure made to be of a floating potential in the first gate region and the SIT-mode beam base structure in the second base region and the n− channel SIT 621. FIG. 13B shows the circuit formation. The electrode parts 600, 611, 616 and 617 represent respectively the cathode electrode and anode electrode of the thyristor and the gate electrode and drain electrode of the SIT. The beam base structure is formed of the n+ base region 609 and n− base region 610 and, at the same time, the n+ base region 609 is made common with the source region of the light quenching SIT 621. The voltage proofing function between the anode and second beam base layer is secured by the n− high resistance layer 613 between the p+ region 612 and beam base layers 609 and 610. The optical fibers 604 and 605 are respectively to introduce the light triggering light pulse $L_{on}$ and light quenching light pulse $L_{off}$ In the operation circuit in FIG. 13B, the voltage $V_{dn}$ by the current source 622 biases the drain of the SIT 621 and, at the same time, produces the reverse bias voltage to the second base 609 of the thyristor 620 at the time of the light quenching operation to elevate the potential of the n− layer 610 and control the injection of the positive holes from the p+ anode 612. 624 represents the gate resistor of the SIT 621 and 623 represents the reverse gate bias voltage source of the SIT 621. In FIG. 13A, the n+ regions 601 and 625 are respectively the cathode region of the thyristor 620 and the drain region of the SIT 621. p+ region 607 is the first gate region made to be of a floating potential of the thyristor 620 and forms the SIT gate structure between it and the n− high resistance channel region 606. The n− high resistance layer 602 is a region to secure the voltage proofing function between the first gate 607 of the thyristor 620 and cathode n+ region 601. It is natural that the potential of the n− layer 606 can vary due to the static induction effect by the potential of the p+ gate region 607. The n− high resistance layer 608 is a region to secure the voltage proofing function between the anode and cathode of the thyristor of this embodiment. The n− layer 614 is the channel region of the SIT 621 and is formed simultaneously with the n− layer 613. The regions 603 and 627 are insulators. The light triggering light pulse $L_{on}$ introduced by the optical fiber 604 is made to enter the high resistance layers 602, 606 and 608 through the insulator film 603 from the region 626 formed to be thin within the n+ cathode region 601. The operation waveforms of the embodiment shown in FIGS. 13A and 13B are the same as the operation waveforms shown in FIGS. 2B and 2C or FIGS. 4B and 4C.

In the embodiments shown in FIGS. 11A to 13B, the SIT structure or SIT mode beam base structure is formed as one gate or base layer and the other base or gate region is formed as a floating beam base structure or SIT gate structure. As one is made to float, the role of the gate or base as of the general thyristor is meant only by the other gate or base region to which the SIT or SIT mode bipolar transistor is connected. For this reason, the thyristor devices whose sectioned structures are shown in FIGS. 11A to 13B are called single gate type SI thyristors or single base type beam base thyristors.

Figure 14:
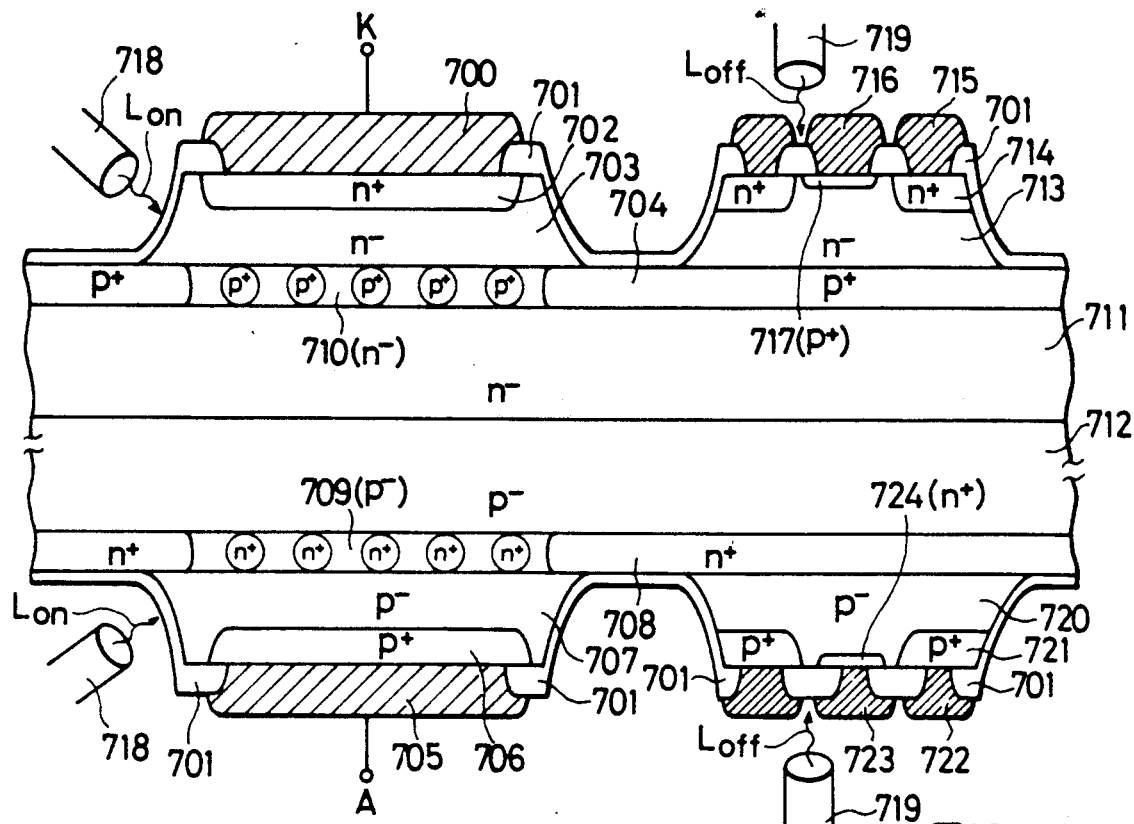
FIG. 14 is a sectioned structure view of an embodiment of the element according to the present invention using a double gate type SI thyristor.
Figure 16:
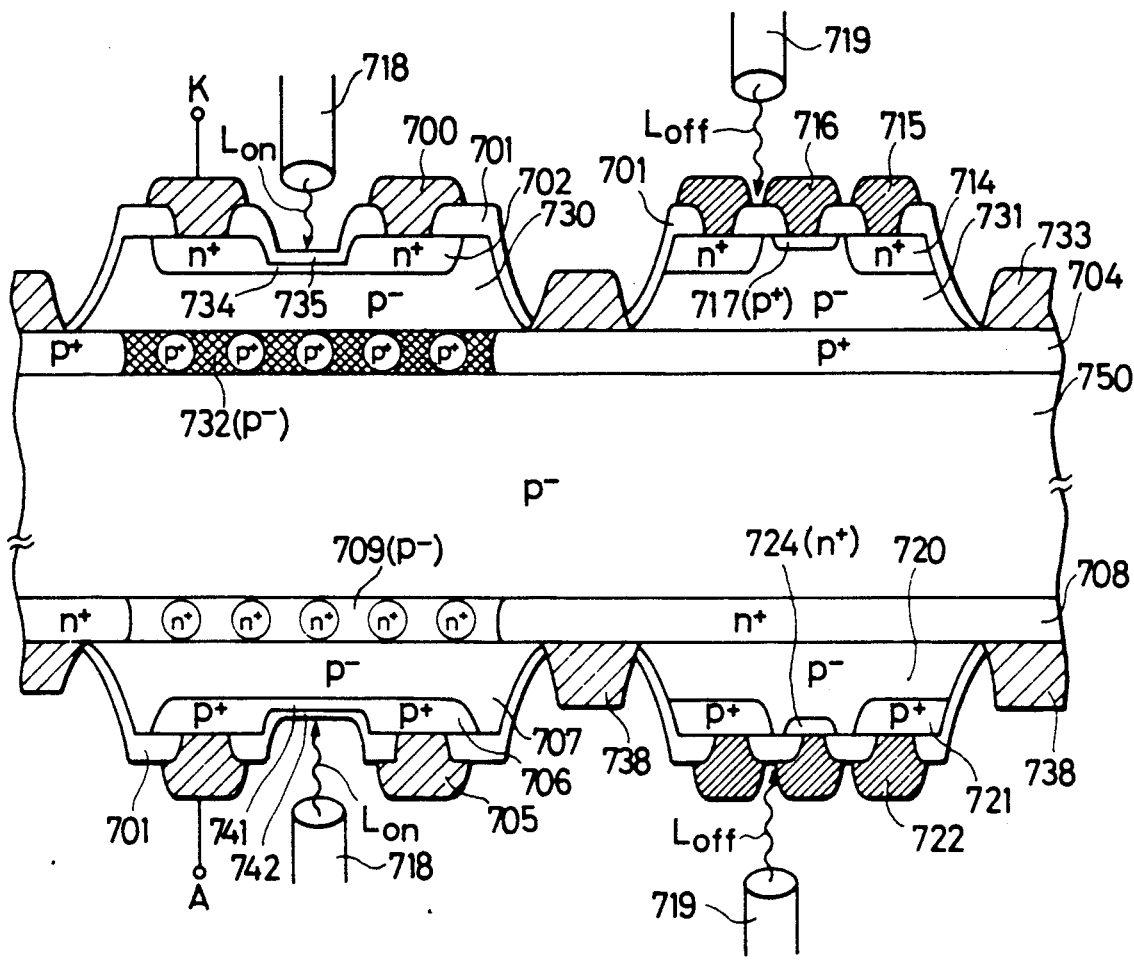
FIG. 16 is a sectioned structure view of an embodiment of the element according to the present invention using a thyristor having a beam base structure in the first base region and an SIT gate structure in the second gate region.

On the other hand, the embodiments shown in FIGS. 14 to 16 show the integrated structures wherein the light quenching SIT's or SIT-mode bipolar transistors are connected to the first gates or first bases and second gates or second bases.

FIG. 14 shows an embodiment of the present invention by the double gate type SI thyristor. In both first gate and second gate regions, the SIT-mode bipolar phototransistors are integrated. The operation circuit is the same as the operation circuits shown in FIGS. 4A, 6B and 7B in which the SIT-mode pnp bipolar transistors are connected instead of the p-channel SIT's 800, 190 and 240 and the SIT-mode npn bipolar transistors are connected instead of the n− channel SIT's 90, 200 and 250. The operating method can be carried out the same by using the operation waveforms shown in FIGS. 4B and 4C. As a matter of course, the series connection, parallel connection and series-parallel connection using the double gate type, double base type and gate-base type thyristors shown in FIGS. 14 to 16 are effective for a large electric power. The embodiment in FIG. 14 shall be explained. Even in the embodiments in FIGS. 15 and 16, the same reference numerals are used for the same respective regions. The electrode parts 700 and 705 represent respectively the cathode electrode and anode electrode of the thyristor. The p+ gate region 704 represents the first gate region of the SI thyristor and, at the same time, is made common with the emitter region of the light quenching p+n−p+ bipolar transistor of the SIT mode. Further, the n+ region 714 and n region 713 represent the base layers and the p region 717 is the collector region. The electrode parts 715 and 716 represent respectively the base electrode and collector electrode. The n+ gate region 708 represents the second gate region of the SI thyristor and, at the same time, is made common with the emitter region of the light quenching n+p−n+ bipolar transistor of the SIT mode. Further, the p+ region 721 and p region 720 represent the base layers and the n+ region 724 represents the collector region. The electrode parts 722 and 723 represent respectively the base electrode and collector electrode. The n+ region 702 represents the cathode region and the p+ region 706 represents the anode region. The n− high resistance layer 703 is the region to enlarge the breakdown voltage between the p+ gate 704 and n+ cathode 702. The n− region 710 is the channel region near the first gate. The n− region 711 and p− region 712 are the regions to enlarge the breakdown voltage in the middle part between the first gate and second gate. The p− region 709 is the channel region near the second gate. The p− high resistance layer 707 is the region to enlarge the breakdown voltage between the second gate and anode. The region 701 represents the insulator layer. The optical fiber 718 is set to introduce the light triggering light pulse $L_{on}$ from the bevel region between the first gate and cathode of the thyristor and the bevel region between the second gate and anode. The optical fiber 719 is to emit the light quenching light pulse $L_{off}$ to the SIT's connected to the first gate and second gate. It is preferable that the wavelength range of the light triggering light pulse $L_{on}$ is of wavelength which can enter the vicinities of the high resistance channel regions 710 and 709 and further deep the n− layer 711 or p− layer 712. On the other hand, it is preferable that the wavelength range of the light quenching light pulse $L_{off}$ is such that the entering distance is within the range of the thicknesses of the n⁻ layer 713 and p⁻ layer 720. The gate electrodes 715 and 722 and collector electrodes 716 and 723 of the SIT-mode bipolar transistor part may be Al electrodes but polysilicon electrodes or transparent electrodes are preferable. The embodiments shown in FIGS. 14 to 16 have means of pulling out the accumulated carriers simultaneously from both of the first gate or first base and the second gate or second base. Therefore, the turning-off speed is made higher by one figure than in the embodiments shown in FIGS. 11A to 13.

FIG. 15 shows an embodiment of the present invention using the double base type beam base thyristor. In the embodiment in FIG. 15, the p⁻ regions 730, 732, 736 and 731 are provided instead of the n⁻ regions 703, 710, 711 and 713 and the n⁻ regions 739, 743, 737 and 740 are provided instead of the p⁻ regions 707, 709, 712 and 720. The light triggering light pulse $L_{on}$ introduced through the optical fiber 718, on one hand, passes through the n⁺ region 734 made thin by etching a part of the cathode region 702 and the insulator layer 735 and enters the p⁻ high resistance layers 730, 732 and 736 and, on the other hand, passes through the p⁺ region 741 made thin by etching a part of the anode region 706 and the insulator 742 and enters the n⁻ high resistance layers 739, 743 and 737. In the embodiment in FIG. 15, the electrode 733 to the p⁺ base region 704 and electrode 738 to the n⁺ base region 708 are formed. Further, the first p⁺ base region 704 is made common with the source region of the p-channel SIT, the n⁺ region 714 represents the gate region of the p-channel SIT, the p⁻ region 731 represents the channel region, the p⁺ region 717 represents the drain region and the electrode parts 715 and 716 are respectively the gate electrode and drain electrode. The second n⁺ base region 708 is common with the source electrode of the n-channel SIT, The p⁺ region 721 is the gate region of the n⁻ channel SIT, n region 740 is the channel region and n⁺ region 743 is the drain region. The electrode parts 722 and 723 represent respectively the gate electrode and drain electrode of the n⁻ channel SIT. The structural embodiment shown in FIG. 15 corresponds to the circuit embodiment shown in FIG. 8. In the case of using the normally-off SIT as the light quenching transistor, in FIGS. 6B or 7B, the double gate type SI thyristors 180 and 230 will be replaced with the double base type beam base thyristors. For the operation waveforms, the operation waveforms shown in FIGS. 2B, 2C, 4B and 4C may be used.

FIG. 16 shows an embodiment of the present invention by the thyristor having the beam base structure in the first base region and the SIT gate structure in the second gate region. The beam base structure is formed in front of the cathode region 702 by the first p⁺ base region 704 and p⁻ base region 732 and the SIT gate structure is formed in front of the anode region 706 by the second n⁺ gate region 708 and p⁻ channel region 709. The p⁺ base region 704 is made common with the source region of the p-channel SIT. On the other hand, the n⁺ gate region 708 is made common with the emitter region of the SIT-mode n⁺p⁻n⁺ bipolar transistor. This embodiment is different from the embodiment in FIG. 15 in respect that the parts corresponding to the n high resistance layers 737, 743, 739 and 740 in FIG. 15 are formed the same as in the embodiment in FIG. 14 respectively by the p⁻ high resistance layers 750, 709, 707 and 720. The operating method and operation waveforms in the embodiment in FIG. 16 are the same as in the case of the embodiment in FIG. 15. The embodiment in FIG. 16 is structurally a combination of the embodiments in FIGS. 14 and 15. In the same manner, as another combination, in FIG. 16, the respective parts of the p⁻ high resistance regions 730, 732, 750, 709, 707, 720 and 731 may be made n⁻ high resistance regions. In such case, the second base region will be of the beam base structure, the SIT-mode p⁺n⁻p⁺ bipolar transistor will be connected to the first p⁺ gate region 704 and the n channel SIT will be connected to the second n⁺ base region 708.

What is claimed is:

1. A light quenchable thyristor device comprising:
   light sensitive thyristor means, having a static induction control electrode for triggering into a conduction state between an anode and a cathode of said thyristor means when illuminated by a first light pulse;
   light sensitive transistor means, having first and second conducting electrodes, said first conducting electrode being connected to said static induction control electrode of said thyristor means, and said transistor means having a control electrode, said transistor means conducting between said first and second conducting electrodes when said transistor means is illuminated with a second light pulse and non-conducting between said first and second conducting electrodes when not illuminated with said second light pulse;
   first means for emitting said first light pulse as triggering to said thyristor means;
   said cathode of said thyristor means being connected to a circuit ground;
   a first bias voltage source connected in series between said second conducting electrode and said circuit ground;
   a second bias voltage source connected in series between said control electrode of said transistor means and said circuit ground; and
   second means located to have an optical path to said transistor means, for emitting a second light pulse to operate said transistor means in a way such that a bias voltage from said second bias voltage source is applied between the control electrode of said transistor means and said cathode of said thyristor means through a resistance when said transistor means is not illuminated with said second light pulse.

2. A thyristor device according to claim 1 wherein said thyristor is a single gate type static induction thyristor.

3. A thyristor device according to claim 1 wherein said thyristor is a single base type beam base thyristor.

4. A thyristor device according to claim 1 wherein said transistor is a p-channel static induction transistor.

5. A thyristor device according to claim 1 wherein said transistor is an n-channel static induction transistor.

6. A thyristor device according to claim 1 wherein said transistor is an SIT-mode pnp bipolar transistor.

7. A light quenchable thyristor device wherein a plurality of light quenchable thyristor devices according to claim 1 are connected in series.

8. A light quenchable thyristor device wherein a plurality of light quenchable thyristor devices according to claim 1 are connected in parallel.

9. A light quenchable thyristor device comprising:

a single gate type static induction light activatable thyristor having a control, a cathode and an anode electrode mounted on a semiconductor substrate and having an optical pathway;

an SIT-mode bipolar light activatable transistor mounted on the same semiconductor substrate, and having source and drain electrodes, said drain electrode being electrically connected with a control electrode of said thyristor;

first means, located such that an optical path is defined between said first means and said thyristor, for emitting a light triggering light pulse to said thyristor;

second means for emitting a quenching light pulse to said transistor;

said cathode of said thyristor being connected to a circuit ground;

a first bias voltage source being connected in series between said source electrode and said circuit ground; and a resistor, and a second bias voltage source connected in series between the control electrode of said transistor and said circuit ground.

10. A light quenchable thyristor device comprising:
a light actuatable, dual-control electrode thyristor having an optical pathway and having cathode, anode, first and second control electrodes, a first light actuatable transistor having an optical pathway and source and drain electrodes and a control electrode, said source electrode being electrically connected with the first control electrode of said thyristor, a second light actuatable transistor having an optical pathway, source and drain electrodes and a control electrode, said source electrode being electrically connected with the second control electrode of said thyristor, first means, located to have an optical path to said optical pathway of said thyristor, for emitting a light triggering light pulse to said thyristor, means located to have optical paths to said optical pathways of said first and second transistors, for emitting a light quenching light pulse to said first and second transistors, a first bias voltage source, which can include zero volts, being connected in series between the drain electrode of said first transistor and the cathode electrode of said thyristor, a first resistance and a second bias voltage source being connected in series between the control electrode of said first transistor and the cathode of said thyristor, a third bias voltage source, which can include zero volts, being connected in series between the drain electrode of said second transistor and the anode electrode of said thyristor, and a second resistance and a fourth bias voltage source being connected in series between the control electrode of said second transistor and the anode electrode of said thyristor.

11. A thyristor device according to claim 10 wherein said thyristor is a double gate type static induction thyristor.

12. A thyristor device according to claim 10 wherein said thyristor is a double base type beam base thyristor.

13. A thyristor device according to claim 10 wherein said first and second transistors are respectively an SIT-mode pnp bipolar transistor and SIT-mode npn bipolar transistor.

14. A thyristor device according to claim 10 wherein said first and second transistors are respectively p-channel static induction transistor and n-channel static induction transistor.

15. A thyristor device according to claim 10 wherein either one of said first and second transistors is an n-channel or p-channel static induction transistor and the other is an SIT-mode pnp and npn bipolar transistor.

16. A light quenchable thyristor device wherein a plurality of light quenchable thyristor devices according to claim 10 are connected in series.

17. A light quenchable thyristor device wherein a plurality of light quenchable thyristor devices according to claim 10 are connected in parallel.

18. A light quenchable thyristor device comprising:
one of a double gate type static induction light actuatable thyristor and a double base type beam base light actuatable thyristor having an optical pathway and having cathode, anode, first and second control electrodes;

a first light actuatable transistor having an optical pathway and source and drain electrodes, said source electrode being electrically connected with the first control electrode of said thyristor;

a second light actuatable transistor having an optical path and source and drain electrodes, said source electrode being electrically connected with the second control electrode of said thyristor;

means having an optical path to said thyristor, means having an optical path to said first and second transistors for emitting a light triggering light pulse to said first and second transistors, a first bias voltage source, which can include zero volts, being connected in series between the drain electrode of said first transistor and the cathode electrode of said thyristor, a resistance and a second bias voltage source being connected in series between the control electrode of said first transistor and the cathode electrode of said thyristor, a third bias voltage source, which can include zero volts, being connected in series between the drain electrode of said second transistor and the anode of said thyristor, a second resistance and a fourth bias voltage source being connected in series between the control electrode of said second transistor and the anode of said thyristor, and wherein one of said double gate type static induction thyristor and double base type beam base thyristor, and said first and second transistors are integrated within the same semiconductor substrate.

19. A light quenchable thyristor device comprising:
a single gate type static induction light activatable thyristor having a control, a cathode and an anode electrode mounted on a semiconductor substrate and having an optical pathway;

an SIT-mode bipolar light activatable transistor mounted on the same semiconductor substrate, having source and drain electrodes, said source electrode being electrically connected with said control electrode of said thyristor;

first means located such that an optical path is defined between said first means and said thyristor for emitting a light triggering light pulse to said thyristor;

second means for emitting a quenching light pulse to said transistor;

said cathode electrode of said thyristor being connected to a circuit ground;

a first bias voltage source being connected in series between said drain electrode and said circuit ground; and a resistor and a second bias voltage source being connected in series between the control electrode of said transistor and said circuit ground.

20. A light quenchable thyristor device comprising:

a light actuatable, dual-control electrode thyristor having an optical pathway and having cathode, anode, first and second control electrodes, a first light actuatable transistor having an optical pathway and first and second conducting electrodes and a control electrode, said second conducting electrode being electrically connected with the first control electrode of said thyristor, a second light actuatable transistor having an optical pathway, first conducting, second conducting electrode being electrically connected with the second control electrode of said thyristor, first means, located to have an optical path to said optical pathway of said thyristor, for emitting a light triggering light pulse to said thyristor, means located to have optical paths to said optical pathways of said first and second transistors, for emitting a light quenching light pulse to said first and second transistor, a first bias voltage source, which can include zero volts, being connected in series between the first conducting electrode of said first transistor and the cathode electrode of said thyristor, a first resistance and a second bias voltage source being connected in series between the control electrode of said first transistor and the cathode of said thyristor, a third bias voltage source, which can include zero volts, being connected in series between the first conducting electrode of said second transistor and the anode electrode of said thyristor, and a second resistance and a fourth bias voltage source being connected in series between the control electrode of said second transistor and the anode electrode of said thyristor.

21. A light quenchable thyristor device comprising:

one of a double gate type static induction light activatable thyristor and a double base type beam base light actuatable thyristor having an optical pathway and having cathode, anode, first and second control electrodes;

a first light actuatable transistor having an optical pathway and first conducting, second conducting and control electrodes, said second conducting electrode being electrically connected with the first control electrode of said thyristor;

a second light actuatable transistor having an optical path and first conducting, second conducting and control electrodes, said second conducting electrode being electrically connected with the first control electrode of said thyristor;

a second light actuatable transistor having an optical path and first conducting, second conducting and control electrodes, said second conducting electrode being electrically connected with the second control electrode of said thyristor;

means having an optical path to said thyristor, means having an optical path to said first and second transistors for emitting a light triggering light pulse to said first and second transistors, a first bias voltage source which can include zero volts, being connected in series between the first conducting electrode of said first transistor and the cathode electrode of said thyristor, a resistance and a second bias voltage source being connected in series between the control electrode of said first transistor and the cathode electrode of said thyristor, a third bias voltage source which can include zero volts, being connected in series between the first conducting electrode of said second transistor and the anode of said thyristor, a second resistance and a fourth bias voltage source being connected in series between the control electrode of said second transistor and the anode of said thyristor, and said first and second transistors integrated within the same semiconductor substrate.

* * * * *